US012757347B2

(12) United States Patent
Milobinski et al.

(10) Patent No.: US 12,757,347 B2
(45) Date of Patent: Oct. 6, 2026

(54) MOUNTING ADAPTOR ASSEMBLIES TO SUPPORT MEMORY DEVICES IN SERVER SYSTEMS

(71) Applicant: Intel Corporation, Santa Clara, CA (US)

(72) Inventors: Marc Milobinski, Scappoose, OR (US); Cong Zhou, Shanghai (CN); Ting Li, Shanghai City (CN); Grant Steen, Bellevue, WA (US)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 17/975,285

(22) Filed: Oct. 27, 2022

(65) Prior Publication Data

US 2023/0054055 A1 Feb. 23, 2023

(30) Foreign Application Priority Data

Sep. 22, 2022 (WO) ................ PCT/CN2022/120666

(51) Int. Cl.
*H05K 7/14* (2006.01)
*G06F 1/16* (2006.01)
*G06F 1/187* (2026.01)

(52) U.S. Cl.
CPC ......... *H05K 7/1489* (2013.01); *G06F 1/1658* (2013.01); *G06F 1/187* (2013.01); *H05K 7/1487* (2013.01)

(58) Field of Classification Search
CPC .. H05K 7/1487; H05K 7/1489; H05K 7/1425; H05K 7/1488; H05K 5/0269; H05K 5/0282; G06F 1/1658; G06F 1/18; G06F 1/187; G06F 1/183; G06F 1/185; G06F 1/181; G06F 1/20; G11B 33/122; G11B 33/123; G11B 33/126; G11B 33/128
USPC ......... 361/679.31, 679.02, 724, 679.37, 727, 361/679.33, 679.32, 728, 729, 730, 725
See application file for complete search history.

(56) References Cited

U.S. PATENT DOCUMENTS

| | | | | |
|---|---|---|---|---|
| D230,116 | S | 1/1974 | Beams | |
| D260,851 | S | 9/1981 | Parker | |
| D330,135 | S | 10/1992 | Furner et al. | |
| 5,155,663 | A * | 10/1992 | Harase | G06K 19/07732 361/740 |
| 5,313,364 | A * | 5/1994 | Omori | G06K 19/07743 361/728 |

(Continued)

OTHER PUBLICATIONS

United States Patent and Trademark Office, "Ex Parte Quayle Action," issued in connection with U.S. Appl. No. 29/881,163, dated Mar. 14, 2025, 6 pages.

(Continued)

*Primary Examiner* — Gage Crum
(74) *Attorney, Agent, or Firm* — Hanley, Flight & Zimmerman, LLC

(57) ABSTRACT

Apparatus, systems, and articles of manufacture are disclosed teaching an apparatus comprising an extender including a body and a tab, the tab coupled to the memory device, a first surface of the tab to be aligned with a second surface of the memory device. Examples disclosed herein further include a bracket to extend across the second surface of the memory device and the first surface of the tab, the bracket coupled to the first surface of the tab via fasteners.

24 Claims, 29 Drawing Sheets

(56) References Cited

U.S. PATENT DOCUMENTS 5,602,717 A * 2/1997 Leshem .............. G06F 13/4081 439/378
5,673,181 A * 9/1997 Hsu ...................... H05K 5/0269 439/946
5,682,291 A * 10/1997 Jeffries ................ G11B 33/124
D390,450 S 2/1998 Rosen
6,064,569 A * 5/2000 Sands ..................... G06F 1/187 361/679.32
6,122,165 A * 9/2000 Schmitt ................ G11B 33/022
D477,606 S 7/2003 Theis et al.
D635,143 S 3/2011 Derry
D656,138 S 3/2012 Wylie
D665,813 S 8/2012 Wylie
8,547,690 B2 * 10/2013 Hu ....................... G11B 33/124 365/185.11
8,561,295 B2 * 10/2013 Hubert ................... H01R 31/06 29/874
8,817,460 B2 * 8/2014 Yu ........................ G11B 33/128 361/679.33
D725,639 S 3/2015 Kim
9,281,015 B1 * 3/2016 Wu ...................... H05K 7/1488
9,468,129 B1 * 10/2016 Wang ................... G11B 33/124
D773,468 S 12/2016 Ellis, II
9,648,775 B2 * 5/2017 Chen .................... H05K 7/1417
9,653,122 B1 * 5/2017 Chang .................. G11B 33/124
D795,877 S 8/2017 Barron et al.
10,064,305 B1 * 8/2018 Zhai ..................... H05K 7/1461
D846,971 S 4/2019 Wilson et al.
10,249,343 B2 * 4/2019 Chiu ....................... G06F 1/187
D853,366 S 7/2019 Williams et al.
10,359,815 B1 * 7/2019 Lin ...................... H01R 12/721
10,546,616 B2 * 1/2020 Ku ....................... G11B 33/124
10,957,361 B2 * 3/2021 Chen .................... G11B 33/022
D937,075 S 11/2021 Wilson et al.
11,229,140 B2 * 1/2022 Choyikkunnil ...... G11B 33/128
11,556,156 B2 * 1/2023 Norton .................... G06F 1/187
D1,035,426 S 7/2024 Shyu et al.
2005/0007745 A1 * 1/2005 Gochnour .............. H01R 31/06 361/737
2009/0091884 A1 * 4/2009 Walker .................... G06F 1/187 361/679.33
2011/0005068 A1 * 1/2011 Zhang ...................... H05K 7/18 29/729
2012/0299453 A1 * 11/2012 Dunham .............. G11B 33/124 312/352
2015/0023619 A1 1/2015 Yin et al.
2017/0018293 A1 * 1/2017 Chen ....................... G06F 1/187
2017/0164501 A1 * 6/2017 Killen .................. H05K 7/1489
2017/0308132 A1 * 10/2017 Woo ..................... H05K 5/0282
2017/0351304 A1 * 12/2017 Mundt ................. H05K 7/1474
2020/0100381 A1 3/2020 Liu et al.
2020/0301488 A1 * 9/2020 Dallaserra ............... G06F 1/185
2021/0176881 A1 * 6/2021 Lin ...................... H05K 5/0221
2021/0385956 A1 * 12/2021 Cinar ..................... H01R 12/73
2022/0053656 A1 * 2/2022 Lee ......................... G06F 1/187
2022/0117107 A1 * 4/2022 Hur .......................... H05K 7/12
2022/0167520 A1 5/2022 Wu et al.
2022/0272860 A1 * 8/2022 Zhang .................. H05K 7/1488
2022/0300046 A1 * 9/2022 Zhu ......................... G06F 1/187
2022/0342463 A1 * 10/2022 Norton .................... G06F 1/187
2023/0054055 A1 2/2023 Milobinski et al.
2023/0228929 A1 * 7/2023 Guo ..................... G02B 6/0006 362/555
2024/0268054 A1 8/2024 Wang et al.
2024/0284628 A1 8/2024 Chien
2024/0298420 A1 9/2024 Tsorng et al.
2024/0407125 A1 12/2024 Chen et al.
2024/0410421 A1 12/2024 Chen et al.

OTHER PUBLICATIONS

United States Patent and Trademark Office, "Notice of Allowance and Fee(s) Due," issued in connection with U.S. Appl. No. 29/881,163, dated Sep. 18, 2025, 5 pages.

* cited by examiner

MOUNTING ADAPTOR ASSEMBLIES TO SUPPORT MEMORY DEVICES IN SERVER SYSTEMS

RELATED APPLICATION

This patent arises from a continuation of and claims foreign priority to PCT Patent Application No. PCT/CN2022/120666, which was filed on Sep. 22, 2022. PCT Patent Application No. PCT/CN2022/120666 is hereby incorporated herein by reference in its entirety. Priority to PCT Patent Application No. PCT/CN2022/120666 is hereby claimed.

FIELD OF THE DISCLOSURE

This disclosure relates generally to memory devices in servers and, more particularly, to mounting adaptor assemblies to support memory devices in server systems.

BACKGROUND

In recent years, data centers, cloud computing centers, edge computing facilities, and the like include server systems to execute high-performance processes, store large quantities of data, accelerate multi-threaded processes, etc. Some server systems include framed racks to house sleds of varying functionality. The sleds are framed around printed circuit boards and can include processors, memory storage cages, accelerators, etc. The server systems also include cooling systems on the racks to ensure components on the sleds do not overheat and become damaged.

Figure 1:
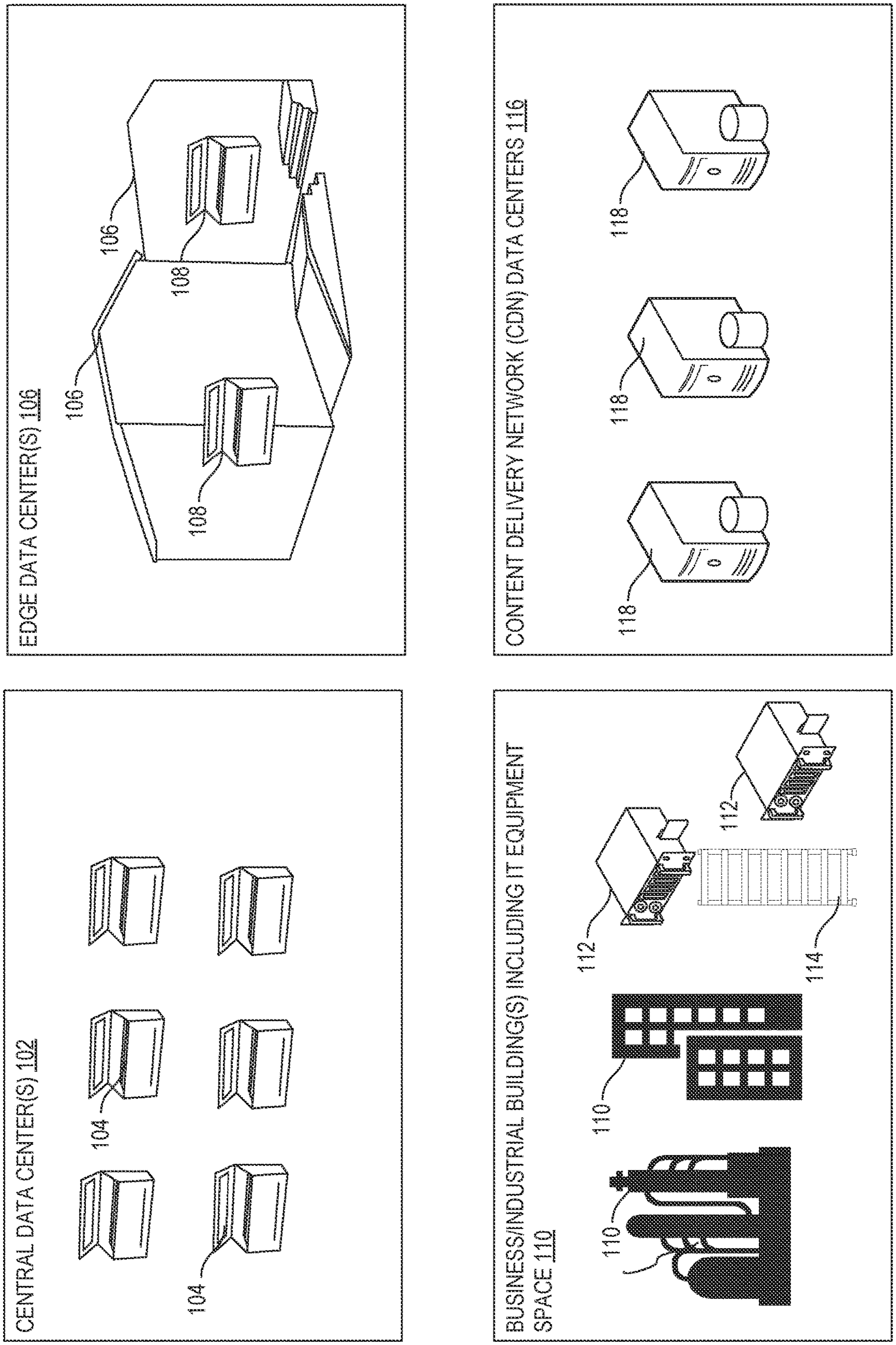
FIG. 1 illustrates one or more example environments in which teachings of this disclosure may be implemented.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein, the term "substantially flush" refers to two or more surfaces and/or planes being coplanar (e.g., on a same plane) recognizing there may be some dimensional tolerance(s) due to imperfect machining, material properties, physical wear, etc. Thus, unless otherwise specified, "substantially flush" refers to two or more coplanar surfaces within +/−0.10 inches.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

FIG. 1 illustrates one or more example environments in which teachings of this disclosure may be implemented. The example environment(s) of FIG. 1 can include one or more central data centers 102. The central data center(s) 102 can store a large number of servers used by, for instance, one or more organizations for data processing, storage, etc. As illustrated in FIG. 1, the central data center(s) 102 include a plurality of immersion tank(s) 104 to facilitate cooling of the servers and/or other electronic components stored at the central data center(s) 102. The immersion tank(s) 104 can provide for single-phase immersion cooling or two-phase immersion cooling.

The example environments of FIG. 1 can be part of an edge computing system. For instance, the example environments of FIG. 1 can include edge data centers or micro-data centers 106. The edge data center(s) 106 can include, for example, data centers located at a base of a cell tower. In some examples, the edge data center(s) 106 are located at or near a top of a cell tower and/or other utility pole. The edge data center(s) 106 include respective housings that store server(s), where the server(s) can be in communication with, for instance, the server(s) stored at the central data center(s) 102, client devices, and/or other computing devices in the edge network. Example housings of the edge data center(s) 106 may include materials that form one or more exterior surfaces that partially or fully protect contents therein, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. As illustrated in FIG. 1, the edge data center(s) 106 can include immersion tank(s) 108 to store server(s) and/or other electronic component(s) located at the edge data center(s) 106.

The example environment(s) of FIG. 1 can include buildings 110 for purposes of business and/or industry that store information technology (IT) equipment in, for example, one or more rooms of the building(s) 110. For example, as represented in FIG. 1, server(s) 112 can be stored with server rack(s) 114 that support the server(s) 112 (e.g., in an opening of slot of the rack 114). In some examples, the server(s) 112 located at the buildings 110 include on-premise server(s) of an edge computing network, where the on-premise server(s) are in communication with remote server(s) (e.g., the server(s) at the edge data center(s) 106) and/or other computing device(s) within an edge network.

The example environment(s) of FIG. 1 include content delivery network (CDN) data center(s) 116. The CDN data center(s) 116 of this example include server(s) 118 that cache content such as images, webpages, videos, etc. accessed via user devices. The server(s) 118 of the CDN data centers 116 can be disposed in immersion cooling tank(s) such as the immersion tanks 104, 108 shown in connection with the data centers 102, 106.

In some instances, the example data centers 102, 106, 116 and/or building(s) 110 of FIG. 1 include servers and/or other electronic components that are cooled independent of immersion tanks (e.g., the immersion tanks 104, 108) and/or an associated immersion cooling system. That is, in some examples, some or all of the servers and/or other electronic components in the data centers 102, 106, 116 and/or building (s) 110 can be cooled by air and/or liquid coolants without immersing the servers and/or other electronic components therein. Thus, in some examples, the immersion tanks 104, 108 of FIG. 1 may be omitted. Further, the example data centers 102, 106, 116 and/or building(s) 110 of FIG. 1 can correspond to, be implemented by, and/or be adaptations of the example data center 200 described in further detail below in connection with FIGS. 2-16.

Although a certain number of cooling tank(s) and other component(s) are shown in the figures, any number of such components may be present. Also, the example cooling data centers and/or other structures or environments disclosed herein are not limited to arrangements of the size that are depicted in FIG. 1. For instance, the structures containing example cooling systems and/or components thereof disclosed herein can be of a size that includes an opening to accommodate service personnel, such as the example data center(s) 106 of FIG. 1, but can also be smaller (e.g., a "doghouse" enclosure). For instance, the structures containing example cooling systems and/or components thereof disclosed herein can be sized such that access (e.g., the only access) to an interior of the structure is a port for service personnel to reach into the structure. In some examples, the structures containing example cooling systems and/or components thereof disclosed herein are be sized such that only a tool can reach into the enclosure because the structure may be supported by, for a utility pole or radio tower, or a larger structure.

Figure 2:
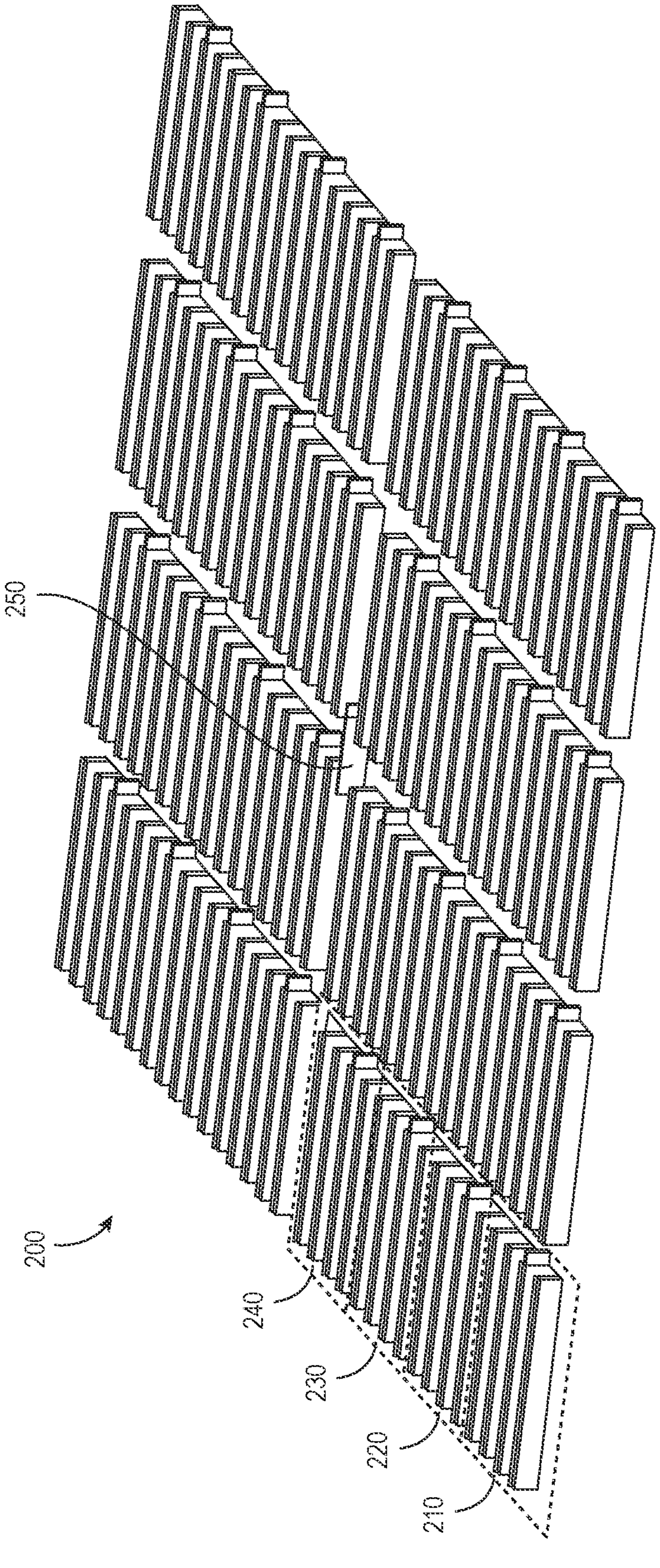
FIG. 2 illustrates at least one example of a data center for executing workloads with disaggregated resources.

FIG. 2 illustrates an example data center 200 in which disaggregated resources may cooperatively execute one or more workloads (e.g., applications on behalf of customers). The illustrated data center 200 includes multiple platforms 210, 220, 230, 240 (referred to herein as pods), each of which includes one or more rows of racks. Although the data center 200 is shown with multiple pods, in some examples, the data center 200 may be implemented as a single pod. As described in more detail herein, a rack may house multiple sleds. A sled may be primarily equipped with a particular type of resource (e.g., memory devices, data storage devices, accelerator devices, general purpose processors), i.e., resources that can be logically coupled to form a composed node. Some such nodes may act as, for example, a server. In the illustrative example, the sleds in the pods 210, 220, 230, 240 are connected to multiple pod switches (e.g., switches that route data communications to and from sleds within the pod). The pod switches, in turn, connect with spine switches 250 that switch communications among pods (e.g., the pods 210, 220, 230, 240) in the data center 200. In some examples, the sleds may be connected with a fabric using Intel Omni-Path™ technology. In other examples, the sleds may be connected with other fabrics, such as InfiniBand or Ethernet. As described in more detail herein, resources within the sleds in the data center 200 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 210, 220, 230, 240. As such, some resources of a single sled may be allocated to one managed node while other resources of the same sled are allocated to a different managed node (e.g., first processor circuitry assigned to one managed node and second processor circuitry of the same sled assigned to a different managed node).

A data center including disaggregated resources, such as the data center 200, can be used in a wide variety of contexts, such as enterprise, government, cloud service provider, and communications service provider (e.g., Telco's), as well in a wide variety of sizes, from cloud service provider mega-data centers that consume over 200,000 sq. ft. to single- or multi-rack installations for use in base stations.

In some examples, the disaggregation of resources is accomplished by using individual sleds that include predominantly a single type of resource (e.g., compute sleds including primarily compute resources, memory sleds including primarily memory resources). The disaggregation of resources in this manner, and the selective allocation and deallocation of the disaggregated resources to form a managed node assigned to execute a workload, improves the operation and resource usage of the data center 200 relative to typical data centers. Such typical data centers include hyperconverged servers containing compute, memory, storage and perhaps additional resources in a single chassis. For example, because a given sled will contain mostly resources of a same particular type, resources of that type can be upgraded independently of other resources. Additionally, because different resource types (processors, storage, accelerators, etc.) typically have different refresh rates, greater resource utilization and reduced total cost of ownership may be achieved. For example, a data center operator can upgrade the processor circuitry throughout a facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 3:
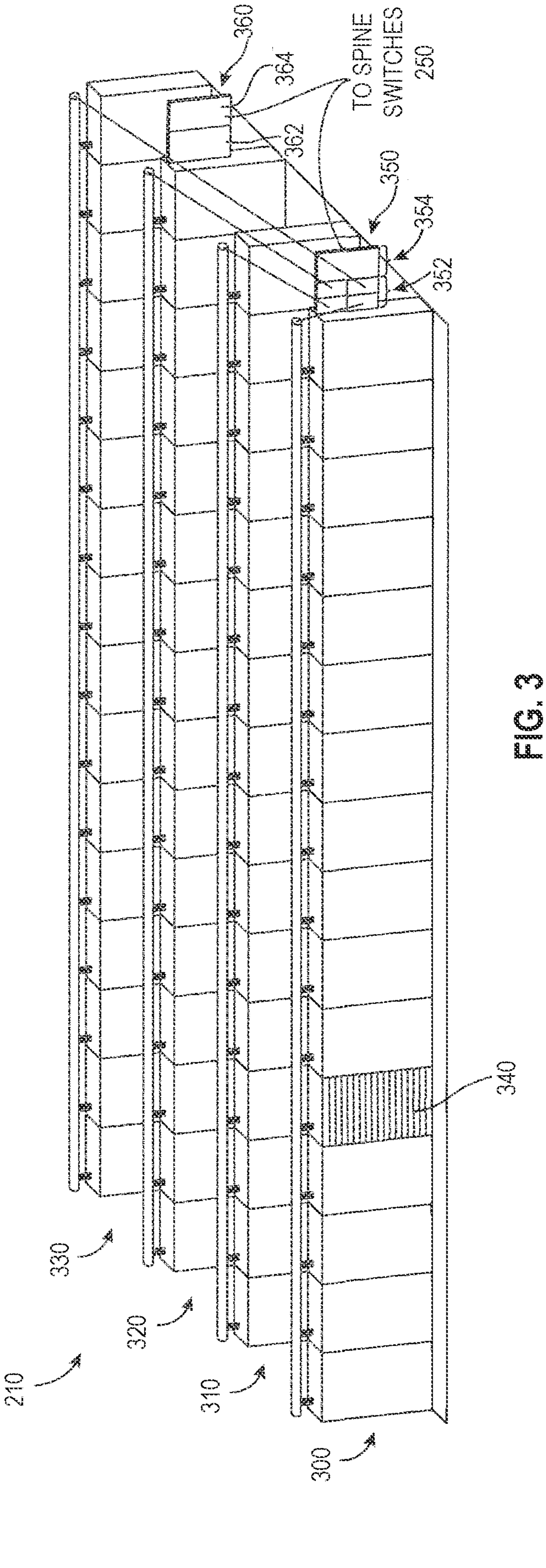
FIG. 3 illustrates at least one example of a pod that may be included in the data center of FIG. 2.

Referring now to FIG. 3, the pod 210, in the illustrative example, includes a set of rows 300, 310, 320, 330 of racks 340. Individual ones of the racks 340 may house multiple sleds (e.g., sixteen sleds) and provide power and data connections to the housed sleds, as described in more detail herein. In the illustrative example, the racks are connected to multiple pod switches 350, 360. The pod switch 350 includes a set of ports 352 to which the sleds of the racks of the pod 210 are connected and another set of ports 354 that connect the pod 210 to the spine switches 250 to provide connectivity to other pods in the data center 200. Similarly, the pod switch 360 includes a set of ports 362 to which the sleds of the racks of the pod 210 are connected and a set of ports 364 that connect the pod 210 to the spine switches 250. As such, the use of the pair of switches 350, 360 provides an amount of redundancy to the pod 210. For example, if either of the switches 350, 360 fails, the sleds in the pod 210 may still maintain data communication with the remainder of the data center 200 (e.g., sleds of other pods) through the other switch 350, 360. Furthermore, in the illustrative example, the switches 250, 350, 360 may be implemented as dual-mode optical switches, capable of routing both Ethernet protocol communications carrying Internet Protocol (IP)

packets and communications according to a second, high-performance link-layer protocol (e.g., PCI Express) via optical signaling media of an optical fabric.

It should be appreciated that any one of the other pods 220, 230, 240 (as well as any additional pods of the data center 200) may be similarly structured as, and have components similar to, the pod 210 shown in and disclosed in regard to FIG. 3 (e.g., a given pod may have rows of racks housing multiple sleds as described above). Additionally, while two pod switches 350, 360 are shown, it should be understood that in other examples, a different number of pod switches may be present, providing even more failover capacity. In other examples, pods may be arranged differently than the rows-of-racks configuration shown in FIGS. 2 and 3. For example, a pod may include multiple sets of racks arranged radially, i.e., the racks are equidistant from a center switch.

Figure 4:
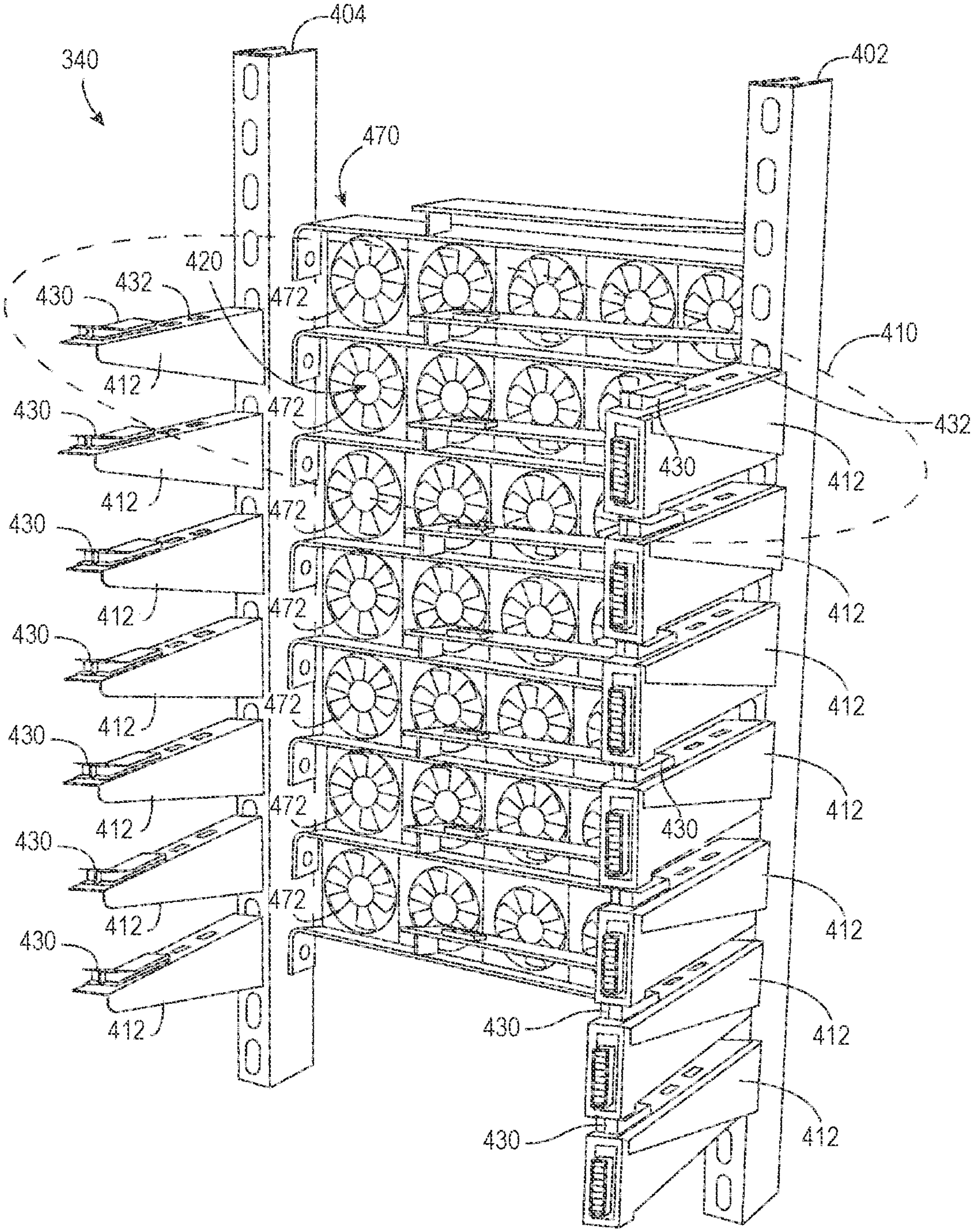
FIG. 4 is a perspective view of at least one example of a rack that may be included in the pod of FIG. 3.
Figure 5:
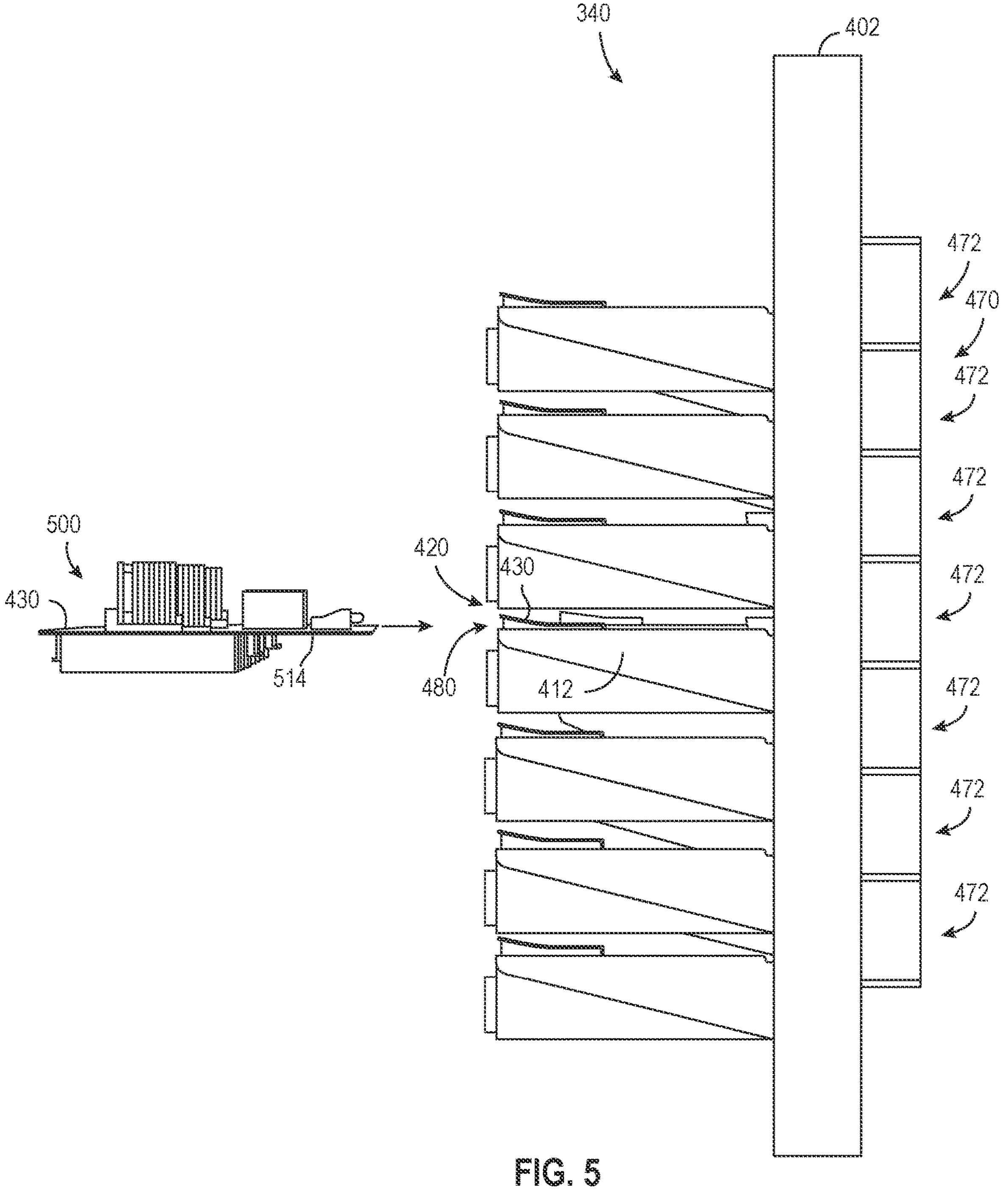
FIG. 5 is a side elevation view of the rack of FIG. 4.
Figure 6:
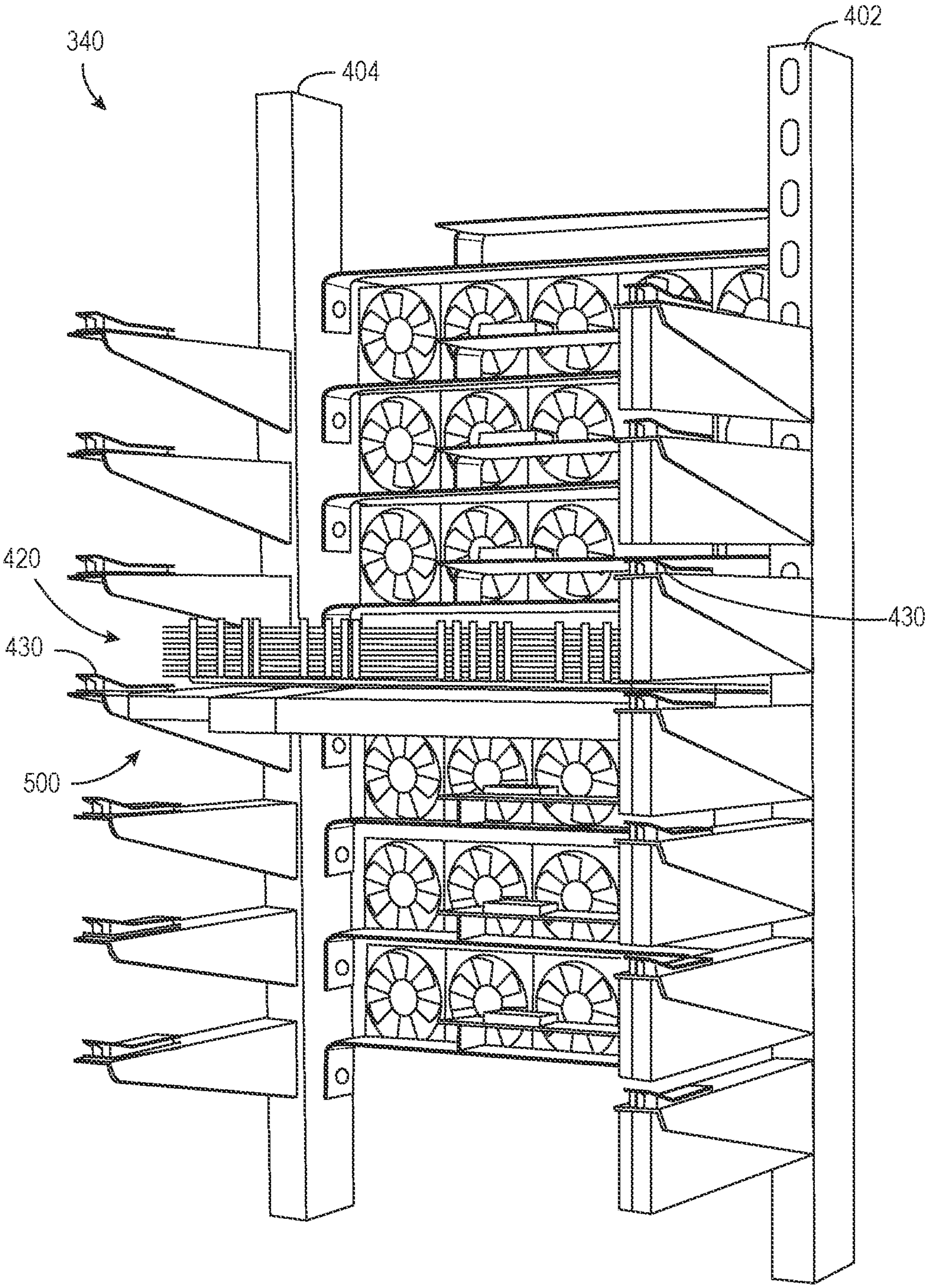
FIG. 6 is a perspective view of the rack of FIG. 4 having a sled mounted therein.

FIGS. 4-6 illustrate an example rack 340 of the data center 200. As shown in the illustrated example, the rack 340 includes two elongated support posts 402, 404, which are arranged vertically. For example, the elongated support posts 402, 404 may extend upwardly from a floor of the data center 200 when deployed. The rack 340 also includes one or more horizontal pairs 410 of elongated support arms 412 (identified in FIG. 4 via a dashed ellipse) configured to support a sled of the data center 200 as discussed below. One elongated support arm 412 of the pair of elongated support arms 412 extends outwardly from the elongated support post 402 and the other elongated support arm 412 extends outwardly from the elongated support post 404.

In the illustrative examples, at least some of the sleds of the data center 200 are chassis-less sleds. That is, such sleds have a chassis-less circuit board substrate on which physical resources (e.g., processors, memory, accelerators, storage, etc.) are mounted as discussed in more detail below. As such, the rack 340 is configured to receive the chassis-less sleds. For example, a given pair 410 of the elongated support arms 412 defines a sled slot 420 of the rack 340, which is configured to receive a corresponding chassis-less sled. To do so, the elongated support arms 412 include corresponding circuit board guides 430 configured to receive the chassis-less circuit board substrate of the sled. The circuit board guides 430 are secured to, or otherwise mounted to, a top side 432 of the corresponding elongated support arms 412. For example, in the illustrative example, the circuit board guides 430 are mounted at a distal end of the corresponding elongated support arm 412 relative to the corresponding elongated support post 402, 404. For clarity of FIGS. 4-6, not every circuit board guide 430 may be referenced in each figure. In some examples, at least some of the sleds include a chassis and the racks 340 are suitably adapted to receive the chassis.

The circuit board guides 430 include an inner wall that defines a circuit board slot 480 configured to receive the chassis-less circuit board substrate of a sled 500 when the sled 500 is received in the corresponding sled slot 420 of the rack 340. To do so, as shown in FIG. 5, a user (or robot) aligns the chassis-less circuit board substrate of an illustrative chassis-less sled 500 to a sled slot 420. The user, or robot, may then slide the chassis-less circuit board substrate forward into the sled slot 420 such that each side edge 514 of the chassis-less circuit board substrate is received in a corresponding circuit board slot 480 of the circuit board guides 430 of the pair 410 of elongated support arms 412 that define the corresponding sled slot 420 as shown in FIG. 5. By having robotically accessible and robotically manipulable sleds including disaggregated resources, the different types of resource can be upgraded independently of one other and at their own optimized refresh rate. Furthermore, the sleds are configured to blindly mate with power and data communication cables in the rack 340, enhancing their ability to be quickly removed, upgraded, reinstalled, and/or replaced. As such, in some examples, the data center 200 may operate (e.g., execute workloads, undergo maintenance and/or upgrades, etc.) without human involvement on the data center floor. In other examples, a human may facilitate one or more maintenance or upgrade operations in the data center 200.

It should be appreciated that the circuit board guides 430 are dual sided. That is, a circuit board guide 430 includes an inner wall that defines a circuit board slot 480 on each side of the circuit board guide 430. In this way, the circuit board guide 430 can support a chassis-less circuit board substrate on either side. As such, a single additional elongated support post may be added to the rack 340 to turn the rack 340 into a two-rack solution that can hold twice as many sled slots 420 as shown in FIG. 4. The illustrative rack 340 includes seven pairs 410 of elongated support arms 412 that define seven corresponding sled slots 420. The sled slots 420 are configured to receive and support a corresponding sled 500 as discussed above. In other examples, the rack 340 may include additional or fewer pairs 410 of elongated support arms 412 (i.e., additional or fewer sled slots 420). It should be appreciated that because the sled 500 is chassis-less, the sled 500 may have an overall height that is different than typical servers. As such, in some examples, the height of a given sled slot 420 may be shorter than the height of a typical server (e.g., shorter than a single rank unit, referred to as "1U"). That is, the vertical distance between pairs 410 of elongated support arms 412 may be less than a standard rack unit "1U." Additionally, due to the relative decrease in height of the sled slots 420, the overall height of the rack 340 in some examples may be shorter than the height of traditional rack enclosures. For example, in some examples, the elongated support posts 402, 404 may have a length of six feet or less. Again, in other examples, the rack 340 may have different dimensions. For example, in some examples, the vertical distance between pairs 410 of elongated support arms 412 may be greater than a standard rack unit "1U". In such examples, the increased vertical distance between the sleds allows for larger heatsinks to be attached to the physical resources and for larger fans to be used (e.g., in the fan array 470 described below) for cooling the sleds, which in turn can allow the physical resources to operate at increased power levels. Further, it should be appreciated that the rack 340 does not include any walls, enclosures, or the like. Rather, the rack 340 is an enclosure-less rack that is opened to the local environment. In some cases, an end plate may be attached to one of the elongated support posts 402, 404 in those situations in which the rack 340 forms an end-of-row rack in the data center 200.

In some examples, various interconnects may be routed upwardly or downwardly through the elongated support posts 402, 404. To facilitate such routing, the elongated support posts 402, 404 include an inner wall that defines an inner chamber in which interconnects may be located. The interconnects routed through the elongated support posts 402, 404 may be implemented as any type of interconnects including, but not limited to, data or communication interconnects to provide communication connections to the sled slots 420, power interconnects to provide power to the sled slots 420, and/or other types of interconnects.

The rack 340, in the illustrative example, includes a support platform on which a corresponding optical data connector (not shown) is mounted. Such optical data connectors are associated with corresponding sled slots 420 and are configured to mate with optical data connectors of corresponding sleds 500 when the sleds 500 are received in the corresponding sled slots 420. In some examples, optical connections between components (e.g., sleds, racks, and switches) in the data center 200 are made with a blind mate optical connection. For example, a door on a given cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 340 also includes a fan array 470 coupled to the cross-support arms of the rack 340. The fan array 470 includes one or more rows of cooling fans 472, which are aligned in a horizontal line between the elongated support posts 402, 404. In the illustrative example, the fan array 470 includes a row of cooling fans 472 for the different sled slots 420 of the rack 340. As discussed above, the sleds 500 do not include any on-board cooling system in the illustrative example and, as such, the fan array 470 provides cooling for such sleds 500 received in the rack 340. In other examples, some or all of the sleds 500 can include on-board cooling systems. Further, in some examples, the sleds 500 and/or the racks 340 may include and/or incorporate a liquid and/or immersion cooling system to facilitate cooling of electronic component(s) on the sleds 500. The rack 340, in the illustrative example, also includes different power supplies associated with different ones of the sled slots 420. A given power supply is secured to one of the elongated support arms 412 of the pair 410 of elongated support arms 412 that define the corresponding sled slot 420. For example, the rack 340 may include a power supply coupled or secured to individual ones of the elongated support arms 412 extending from the elongated support post 402. A given power supply includes a power connector configured to mate with a power connector of a sled 500 when the sled 500 is received in the corresponding sled slot 420. In the illustrative example, the sled 500 does not include any on-board power supply and, as such, the power supplies provided in the rack 340 supply power to corresponding sleds 500 when mounted to the rack 340. A given power supply is configured to satisfy the power requirements for its associated sled, which can differ from sled to sled. Additionally, the power supplies provided in the rack 340 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 7:
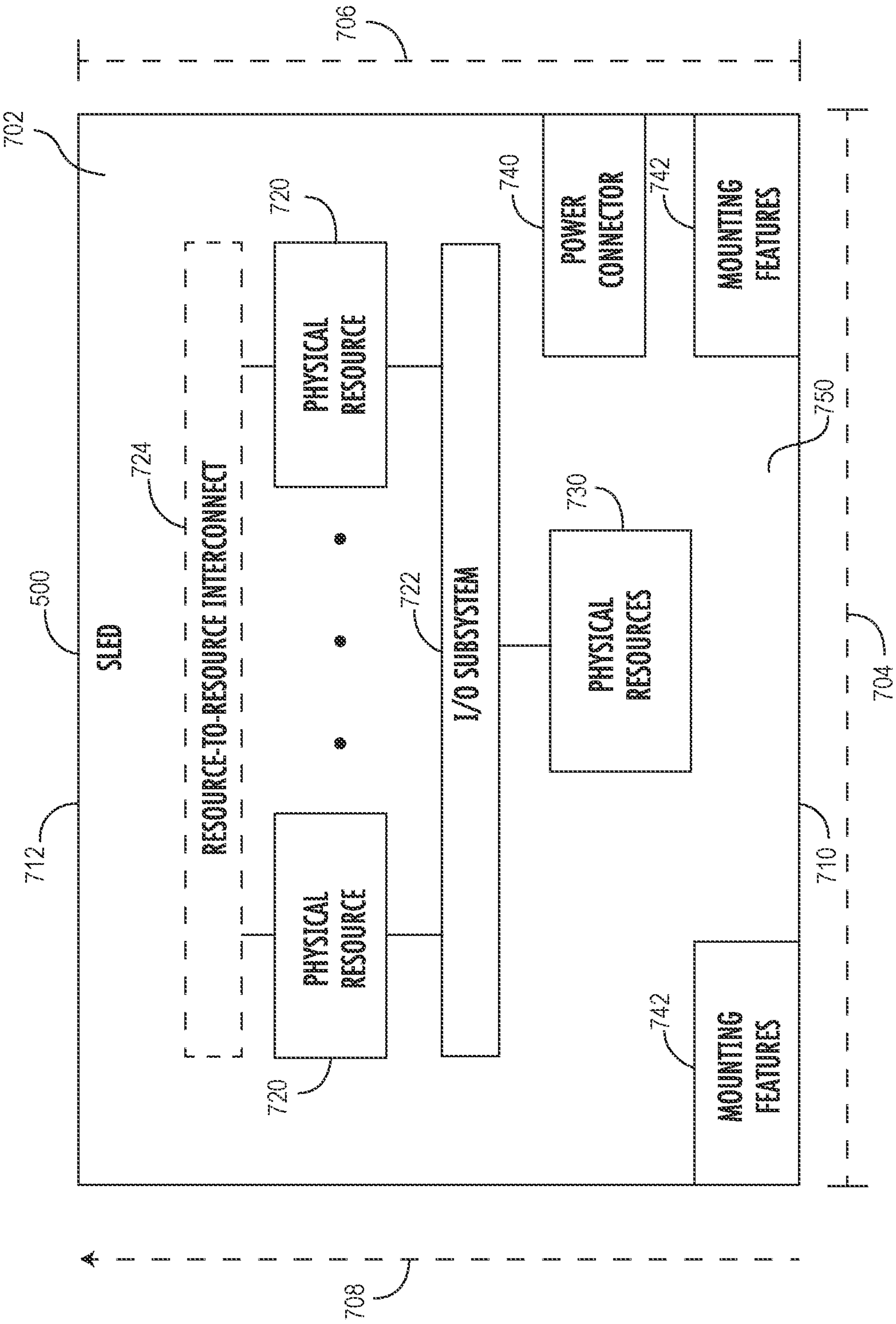
FIG. 7 is a is a block diagram of at least one example of a top side of the sled of FIG. 6.

Referring now to FIG. 7, the sled 500, in the illustrative example, is configured to be mounted in a corresponding rack 340 of the data center 200 as discussed above. In some examples, a give sled 500 may be optimized or otherwise configured for performing particular tasks, such as compute tasks, acceleration tasks, data storage tasks, etc. For example, the sled 500 may be implemented as a compute sled 900 as discussed below in regard to FIGS. 9 and 10, an accelerator sled 1100 as discussed below in regard to FIGS. 11 and 12, a storage sled 1300 as discussed below in regard to FIGS. 13 and 14, or as a sled optimized or otherwise configured to perform other specialized tasks, such as a memory sled 1500, discussed below in regard to FIG. 15.

As discussed above, the illustrative sled 500 includes a chassis-less circuit board substrate 702, which supports various physical resources (e.g., electrical components) mounted thereon. It should be appreciated that the circuit board substrate 702 is "chassis-less" in that the sled 500 does not include a housing or enclosure. Rather, the chassis-less circuit board substrate 702 is open to the local environment. The chassis-less circuit board substrate 702 may be formed from any material capable of supporting the various electrical components mounted thereon. For example, in an illustrative example, the chassis-less circuit board substrate 702 is formed from an FR-4 glass-reinforced epoxy laminate material. Other materials may be used to form the chassis-less circuit board substrate 702 in other examples.

As discussed in more detail below, the chassis-less circuit board substrate 702 includes multiple features that improve the thermal cooling characteristics of the various electrical components mounted on the chassis-less circuit board substrate 702. As discussed, the chassis-less circuit board substrate 702 does not include a housing or enclosure, which may improve the airflow over the electrical components of the sled 500 by reducing those structures that may inhibit air flow. For example, because the chassis-less circuit board substrate 702 is not positioned in an individual housing or enclosure, there is no vertically-arranged backplane (e.g., a back plate of the chassis) attached to the chassis-less circuit board substrate 702, which could inhibit air flow across the electrical components. Additionally, the chassis-less circuit board substrate 702 has a geometric shape configured to reduce the length of the airflow path across the electrical components mounted to the chassis-less circuit board substrate 702. For example, the illustrative chassis-less circuit board substrate 702 has a width 704 that is greater than a depth 706 of the chassis-less circuit board substrate 702. In one particular example, the chassis-less circuit board substrate 702 has a width of about 21 inches and a depth of about 9 inches, compared to a typical server that has a width of about 17 inches and a depth of about 39 inches. As such, an airflow path 708 that extends from a front edge 710 of the chassis-less circuit board substrate 702 toward a rear edge 712 has a shorter distance relative to typical servers, which may improve the thermal cooling characteristics of the sled 500. Furthermore, although not illustrated in FIG. 7, the various physical resources mounted to the chassis-less circuit board substrate 702 in this example are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 702 linearly in-line with each other along the direction of the airflow path 708 (i.e., along a direction extending from the front edge 710 toward the rear edge 712 of the chassis-less circuit board substrate 702). The placement and/or structure of the features may be suitable adapted when the electrical component(s) are being cooled via liquid (e.g., one phase or two phase immersion cooling).

As discussed above, the illustrative sled 500 includes one or more physical resources 720 mounted to a top side 750 of the chassis-less circuit board substrate 702. Although two physical resources 720 are shown in FIG. 7, it should be appreciated that the sled 500 may include one, two, or more physical resources 720 in other examples. The physical resources 720 may be implemented as any type of processor, controller, or other compute circuit capable of performing various tasks such as compute functions and/or controlling the functions of the sled 500 depending on, for example, the type or intended functionality of the sled 500. For example, as discussed in more detail below, the physical resources 720 may be implemented as high-performance processors in examples in which the sled 500 is implemented as a compute sled, as accelerator co-processors or circuits in examples in which the sled 500 is implemented as an accelerator sled, storage controllers in examples in which the sled 500 is implemented as a storage sled, or a set of memory devices in examples in which the sled 500 is implemented as a memory sled.

The sled 500 also includes one or more additional physical resources 730 mounted to the top side 750 of the chassis-less circuit board substrate 702. In the illustrative example, the additional physical resources include a network interface controller (NIC) as discussed in more detail below. Depending on the type and functionality of the sled 500, the physical resources 730 may include additional or other electrical components, circuits, and/or devices in other examples.

The physical resources 720 are communicatively coupled to the physical resources 730 via an input/output (I/O) subsystem 722. The I/O subsystem 722 may be implemented as circuitry and/or components to facilitate input/output operations with the physical resources 720, the physical resources 730, and/or other components of the sled 500. For example, the I/O subsystem 722 may be implemented as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative example, the I/O subsystem 722 is implemented as, or otherwise includes, a double data rate 4 (DDR4) data bus or a DDR5 data bus.

In some examples, the sled 500 may also include a resource-to-resource interconnect 724. The resource-to-resource interconnect 724 may be implemented as any type of communication interconnect capable of facilitating resource-to-resource communications. In the illustrative example, the resource-to-resource interconnect 724 is implemented as a high-speed point-to-point interconnect (e.g., faster than the I/O subsystem 722). For example, the resource-to-resource interconnect 724 may be implemented as a QuickPath Interconnect (QPI), an UltraPath Interconnect (UPI), or other high-speed point-to-point interconnect dedicated to resource-to-resource communications.

The sled 500 also includes a power connector 740 configured to mate with a corresponding power connector of the rack 340 when the sled 500 is mounted in the corresponding rack 340. The sled 500 receives power from a power supply of the rack 340 via the power connector 740 to supply power to the various electrical components of the sled 500. That is, the sled 500 does not include any local power supply (i.e., an on-board power supply) to provide power to the electrical components of the sled 500. The exclusion of a local or on-board power supply facilitates the reduction in the overall footprint of the chassis-less circuit board substrate 702, which may increase the thermal cooling characteristics of the various electrical components mounted on the chassis-less circuit board substrate 702 as discussed above. In some examples, voltage regulators are placed on a bottom side 850 (see FIG. 8) of the chassis-less circuit board substrate 702 directly opposite of processor circuitry 920 (see FIG. 9), and power is routed from the voltage regulators to the processor circuitry 920 by vias extending through the circuit board substrate 702. Such a configuration provides an increased thermal budget, additional current and/or voltage, and better voltage control relative to typical printed circuit boards in which processor power is delivered from a voltage regulator, in part, by printed circuit traces.

In some examples, the sled 500 may also include mounting features 742 configured to mate with a mounting arm, or other structure, of a robot to facilitate the placement of the sled 700 in a rack 340 by the robot. The mounting features 742 may be implemented as any type of physical structures that allow the robot to grasp the sled 500 without damaging the chassis-less circuit board substrate 702 or the electrical components mounted thereto. For example, in some examples, the mounting features 742 may be implemented as non-conductive pads attached to the chassis-less circuit board substrate 702. In other examples, the mounting features may be implemented as brackets, braces, or other similar structures attached to the chassis-less circuit board substrate 702. The particular number, shape, size, and/or make-up of the mounting feature 742 may depend on the design of the robot configured to manage the sled 500.

Figure 8:
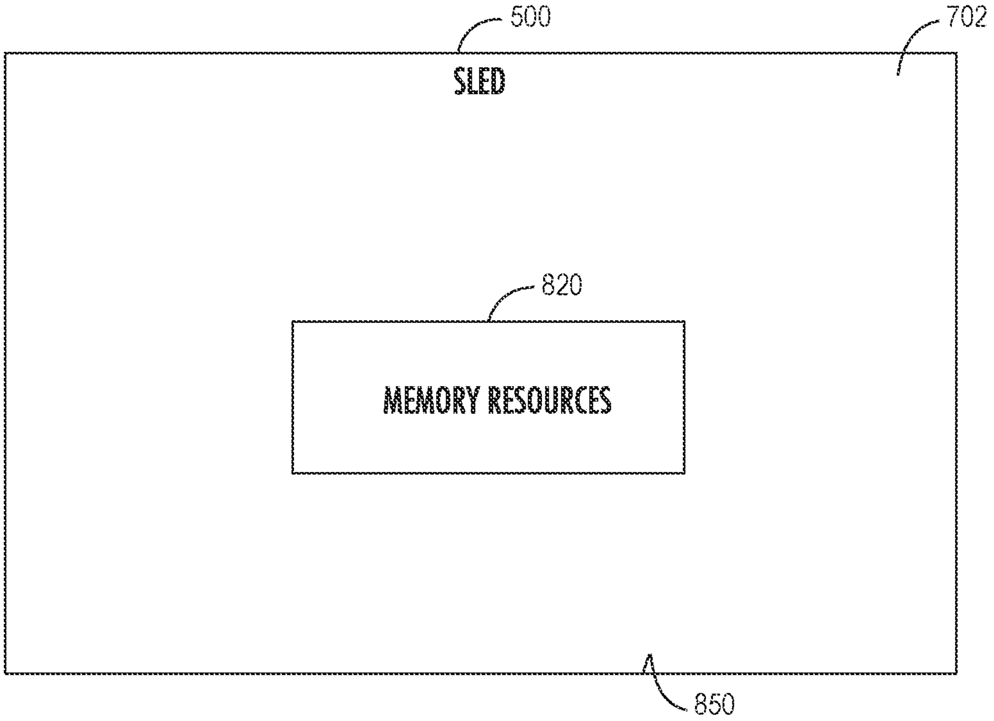
FIG. 8 is a block diagram of at least one example of a bottom side of the sled of FIG. 7.

Referring now to FIG. 8, in addition to the physical resources 730 mounted on the top side 750 of the chassis-less circuit board substrate 702, the sled 500 also includes one or more memory devices 820 mounted to a bottom side 850 of the chassis-less circuit board substrate 702. That is, the chassis-less circuit board substrate 702 is implemented as a double-sided circuit board. The physical resources 720 are communicatively coupled to the memory devices 820 via the I/O subsystem 722. For example, the physical resources 720 and the memory devices 820 may be communicatively coupled by one or more vias extending through the chassis-less circuit board substrate 702. Different ones of the physical resources 720 may be communicatively coupled to different sets of one or more memory devices 820 in some examples. Alternatively, in other examples, different ones of the physical resources 720 may be communicatively coupled to the same ones of the memory devices 820.

The memory devices 820 may be implemented as any type of memory device capable of storing data for the physical resources 720 during operation of the sled 500, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular examples, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one example, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some examples, the memory device may include a transistor-less stackable cross point architecture in which memory cells sit at the intersection of word lines and bit lines and are individually addressable and in which bit storage is based on a change in bulk resistance.

Figure 9:
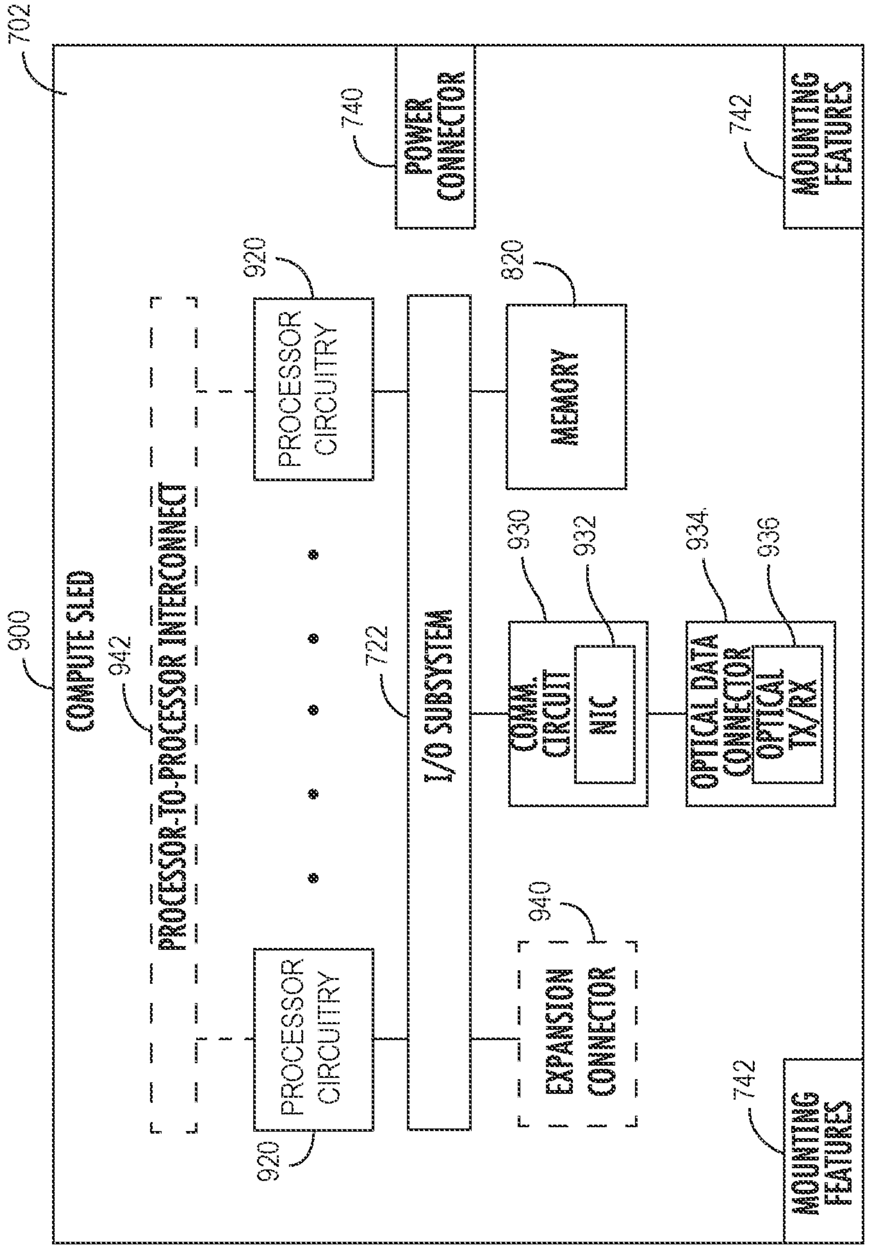
FIG. 9 is a block diagram of at least one example of a compute sled usable in the data center of FIG. 2.

Referring now to FIG. 9, in some examples, the sled 500 may be implemented as a compute sled 900. The compute sled 900 is optimized, or otherwise configured, to perform compute tasks. As discussed above, the compute sled 900 may rely on other sleds, such as acceleration sleds and/or storage sleds, to perform such compute tasks. The compute sled 900 includes various physical resources (e.g., electrical components) similar to the physical resources of the sled 500, which have been identified in FIG. 9 using the same reference numbers. The description of such components provided above in regard to FIGS. 7 and 8 applies to the corresponding components of the compute sled 900 and is not repeated herein for clarity of the description of the compute sled 900.

In the illustrative compute sled 900, the physical resources 720 include processor circuitry 920. Although only two blocks of processor circuitry 920 are shown in FIG. 9, it should be appreciated that the compute sled 900 may include additional processor circuits 920 in other examples. Illustratively, the processor circuitry 920 corresponds to high-performance processors 920 and may be configured to operate at a relatively high power rating. Although the high-performance processor circuitry 920 generates additional heat operating at power ratings greater than typical processors (which operate at around 155-230 W), the enhanced thermal cooling characteristics of the chassis-less circuit board substrate 702 discussed above facilitate the higher power operation. For example, in the illustrative example, the processor circuitry 920 is configured to operate at a power rating of at least 250 W. In some examples, the processor circuitry 920 may be configured to operate at a power rating of at least 350 W.

In some examples, the compute sled 900 may also include a processor-to-processor interconnect 942. Similar to the resource-to-resource interconnect 724 of the sled 500 discussed above, the processor-to-processor interconnect 942 may be implemented as any type of communication interconnect capable of facilitating processor-to-processor interconnect 942 communications. In the illustrative example, the processor-to-processor interconnect 942 is implemented as a high-speed point-to-point interconnect (e.g., faster than the I/O subsystem 722). For example, the processor-to-processor interconnect 942 may be implemented as a QuickPath Interconnect (QPI), an UltraPath Interconnect (UPI), or other high-speed point-to-point interconnect dedicated to processor-to-processor communications.

The compute sled 900 also includes a communication circuit 930. The illustrative communication circuit 930 includes a network interface controller (NIC) 932, which may also be referred to as a host fabric interface (HFI). The NIC 932 may be implemented as, or otherwise include, any type of integrated circuit, discrete circuits, controller chips, chipsets, add-in-boards, daughtercards, network interface cards, or other devices that may be used by the compute sled 900 to connect with another compute device (e.g., with other sleds 500). In some examples, the MC 932 may be implemented as part of a system-on-a-chip (SoC) that includes one or more processors, or included on a multichip package that also contains one or more processors. In some examples, the NIC 932 may include a local processor (not shown) and/or a local memory (not shown) that are both local to the NIC 932. In such examples, the local processor of the NIC 932 may be capable of performing one or more of the functions of the processor circuitry 920. Additionally or alternatively, in such examples, the local memory of the MC 932 may be integrated into one or more components of the compute sled at the board level, socket level, chip level, and/or other levels.

The communication circuit 930 is communicatively coupled to an optical data connector 934. The optical data connector 934 is configured to mate with a corresponding optical data connector of the rack 340 when the compute sled 900 is mounted in the rack 340. Illustratively, the optical data connector 934 includes a plurality of optical fibers which lead from a mating surface of the optical data connector 934 to an optical transceiver 936. The optical transceiver 936 is configured to convert incoming optical signals from the rack-side optical data connector to electrical signals and to convert electrical signals to outgoing optical signals to the rack-side optical data connector. Although shown as forming part of the optical data connector 934 in the illustrative example, the optical transceiver 936 may form a portion of the communication circuit 930 in other examples.

In some examples, the compute sled 900 may also include an expansion connector 940. In such examples, the expansion connector 940 is configured to mate with a corresponding connector of an expansion chassis-less circuit board substrate to provide additional physical resources to the compute sled 900. The additional physical resources may be used, for example, by the processor circuitry 920 during operation of the compute sled 900. The expansion chassis-less circuit board substrate may be substantially similar to the chassis-less circuit board substrate 702 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 10:
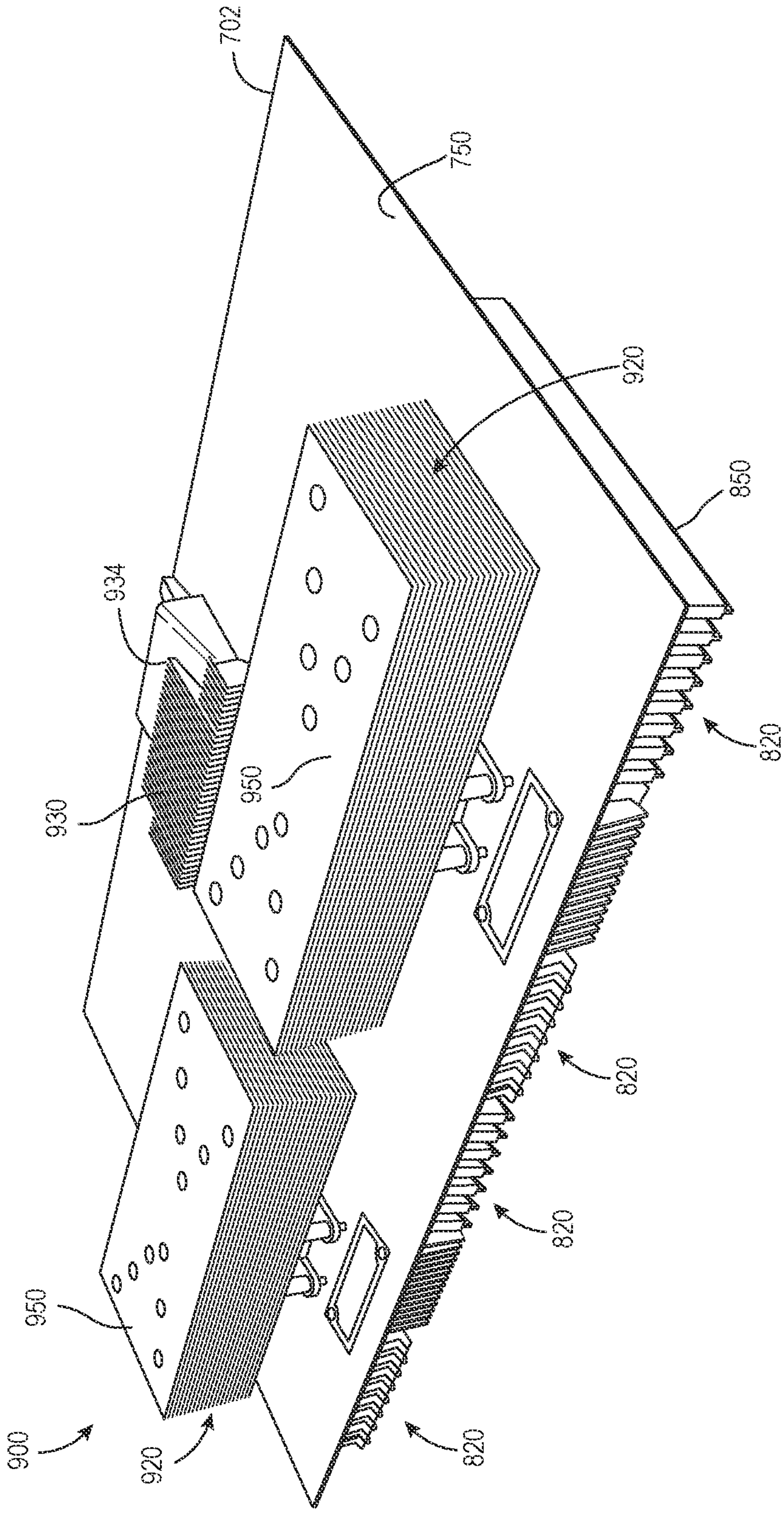
FIG. 10 is a top perspective view of at least one example of the compute sled of FIG. 9.

Referring now to FIG. 10, an illustrative example of the compute sled 900 is shown. As shown, the processor circuitry 920, communication circuit 930, and optical data connector 934 are mounted to the top side 750 of the chassis-less circuit board substrate 702. Any suitable attachment or mounting technology may be used to mount the physical resources of the compute sled 900 to the chassis-less circuit board substrate 702. For example, the various physical resources may be mounted in corresponding sockets (e.g., a processor socket), holders, or brackets. In some cases, some of the electrical components may be directly mounted to the chassis-less circuit board substrate 702 via soldering or similar techniques.

As discussed above, the separate processor circuitry 920 and the communication circuit 930 are mounted to the top side 750 of the chassis-less circuit board substrate 702 such that no two heat-producing, electrical components shadow each other. In the illustrative example, the processor circuitry 920 and the communication circuit 930 are mounted in corresponding locations on the top side 750 of the chassis-less circuit board substrate 702 such that no two of those physical resources are linearly in-line with others along the direction of the airflow path 708. It should be appreciated that, although the optical data connector 934 is in-line with the communication circuit 930, the optical data connector 934 produces no or nominal heat during operation.

The memory devices 820 of the compute sled 900 are mounted to the bottom side 850 of the of the chassis-less circuit board substrate 702 as discussed above in regard to the sled 500. Although mounted to the bottom side 850, the memory devices 820 are communicatively coupled to the processor circuitry 920 located on the top side 750 via the I/O subsystem 722. Because the chassis-less circuit board substrate 702 is implemented as a double-sided circuit board, the memory devices 820 and the processor circuitry 920 may be communicatively coupled by one or more vias, connectors, or other mechanisms extending through the chassis-less circuit board substrate 702. Different processor circuitry 920 (e.g., different processors) may be communicatively coupled to a different set of one or more memory devices 820 in some examples. Alternatively, in other examples, different processor circuitry 920 (e.g., different processors) may be communicatively coupled to the same ones of the memory devices 820. In some examples, the memory devices 820 may be mounted to one or more memory mezzanines on the bottom side of the chassis-less circuit board substrate 702 and may interconnect with a corresponding processor circuitry 920 through a ball-grid array.

Different processor circuitry 920 (e.g., different processors) include and/or is associated with corresponding heatsinks 950 secured thereto. Due to the mounting of the memory devices 820 to the bottom side 850 of the chassis-less circuit board substrate 702 (as well as the vertical spacing of the sleds 500 in the corresponding rack 340), the top side 750 of the chassis-less circuit board substrate 702 includes additional “free” area or space that facilitates the use of heatsinks 950 having a larger size relative to traditional heatsinks used in typical servers. Additionally, due to the improved thermal cooling characteristics of the chassis-less circuit board substrate 702, none of the processor heatsinks 950 include cooling fans attached thereto. That is, the heatsinks 950 may be fan-less heatsinks. In some examples, the heatsinks 950 mounted atop the processor circuitry 920 may overlap with the heatsink attached to the communication circuit 930 in the direction of the airflow path 708 due to their increased size, as illustratively suggested by FIG. 10.

Figure 11:
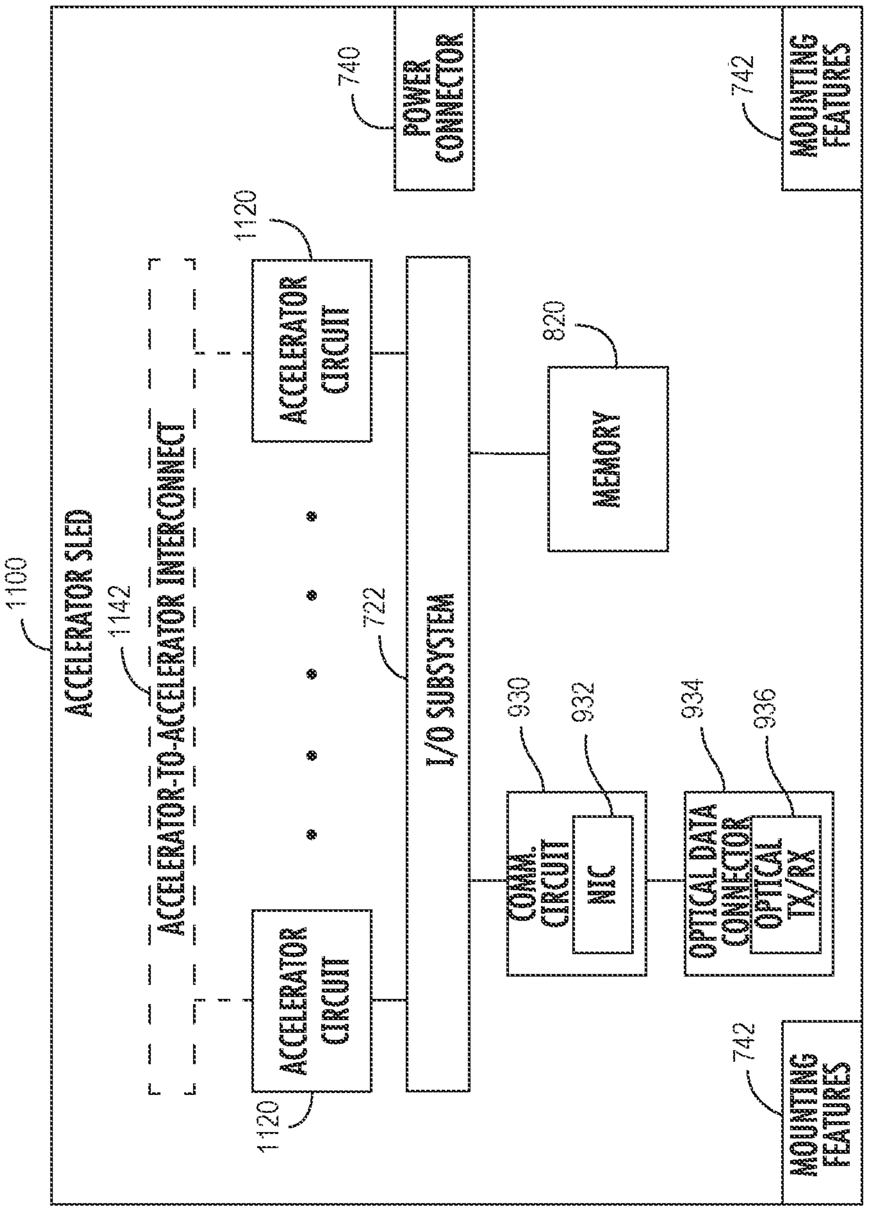
FIG. 11 is a block diagram of at least one example of an accelerator sled usable in the data center of FIG. 2.

Referring now to FIG. 11, in some examples, the sled 500 may be implemented as an accelerator sled 1100. The accelerator sled 1100 is configured, to perform specialized compute tasks, such as machine learning, encryption, hashing, or other computational-intensive task. In some examples, for example, a compute sled 900 may offload tasks to the accelerator sled 1100 during operation. The accelerator sled 1100 includes various components similar to components of the sled 500 and/or the compute sled 900, which have been identified in FIG. 11 using the same reference numbers. The description of such components provided above in regard to FIGS. 7, 8, and 9 apply to the corresponding components of the accelerator sled 1100 and is not repeated herein for clarity of the description of the accelerator sled 1100.

Figure 12:
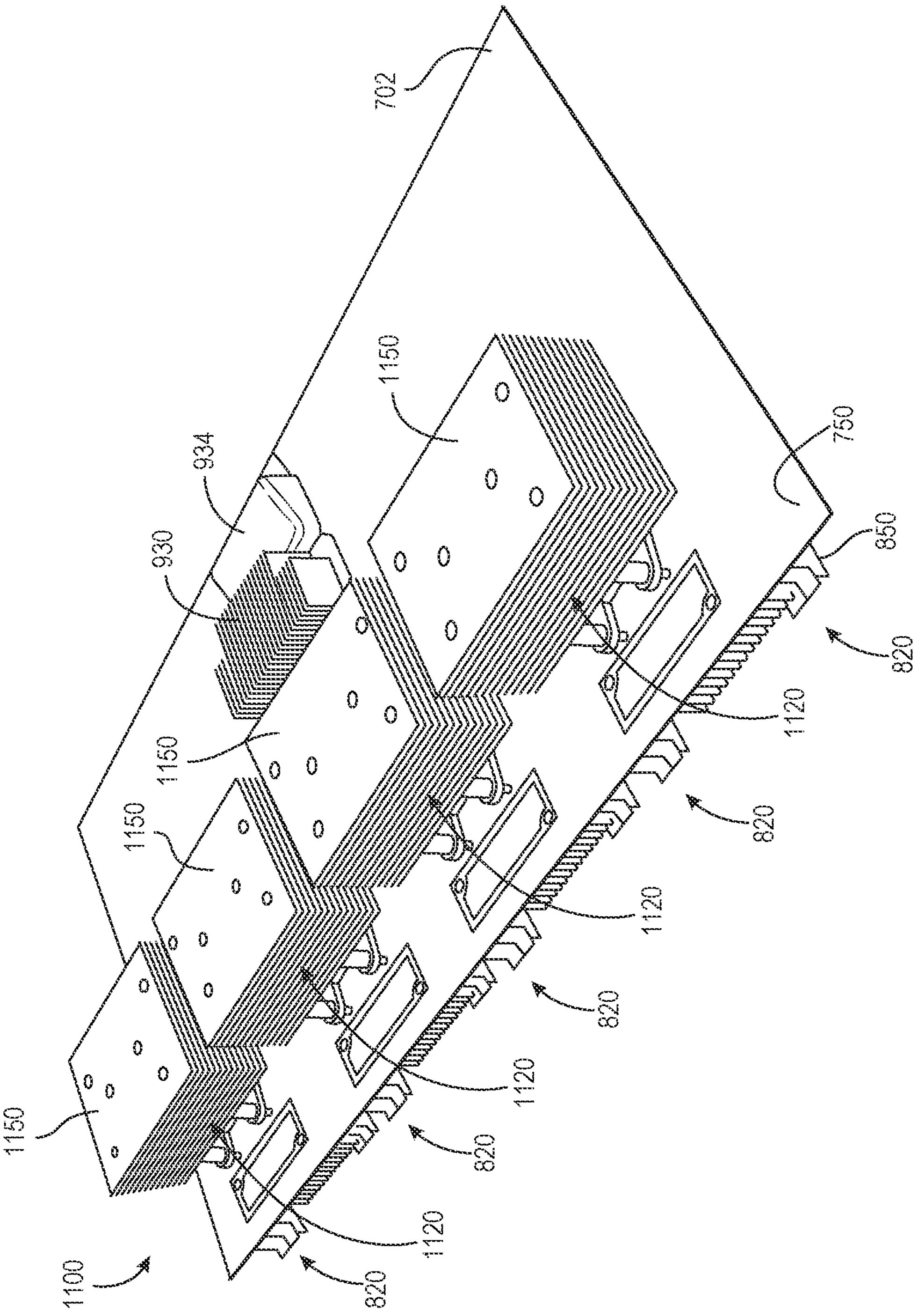
FIG. 12 is a top perspective view of at least one example of the accelerator sled of FIG. 10.

In the illustrative accelerator sled 1100, the physical resources 720 include accelerator circuits 1120. Although only two accelerator circuits 1120 are shown in FIG. 11, it should be appreciated that the accelerator sled 1100 may include additional accelerator circuits 1120 in other examples. For example, as shown in FIG. 12, the accelerator sled 1100 may include four accelerator circuits 1120. The accelerator circuits 1120 may be implemented as any type of processor, co-processor, compute circuit, or other device capable of performing compute or processing operations. For example, the accelerator circuits 1120 may be implemented as, for example, field programmable gate arrays (FPGA), application-specific integrated circuits (ASICs), security co-processors, graphics processing units (GPUs), neuromorphic processor units, quantum computers, machine learning circuits, or other specialized processors, controllers, devices, and/or circuits.

In some examples, the accelerator sled 1100 may also include an accelerator-to-accelerator interconnect 1142. Similar to the resource-to-resource interconnect 724 of the sled 700 discussed above, the accelerator-to-accelerator interconnect 1142 may be implemented as any type of communication interconnect capable of facilitating accelerator-to-accelerator communications. In the illustrative example, the accelerator-to-accelerator interconnect 1142 is implemented as a high-speed point-to-point interconnect (e.g., faster than the I/O subsystem 722). For example, the accelerator-to-accelerator interconnect 1142 may be implemented as a QuickPath Interconnect (QPI), an UltraPath Interconnect (UPI), or other high-speed point-to-point interconnect dedicated to processor-to-processor communications. In some examples, the accelerator circuits 1120 may be daisy-chained with a primary accelerator circuit 1120 connected to the MC 932 and memory 820 through the I/O subsystem 722 and a secondary accelerator circuit 1120 connected to the NIC 932 and memory 820 through a primary accelerator circuit 1120.

Referring now to FIG. 12, an illustrative example of the accelerator sled 1100 is shown. As discussed above, the accelerator circuits 1120, the communication circuit 930, and the optical data connector 934 are mounted to the top side 750 of the chassis-less circuit board substrate 702. Again, the individual accelerator circuits 1120 and communication circuit 930 are mounted to the top side 750 of the chassis-less circuit board substrate 702 such that no two heat-producing, electrical components shadow each other as discussed above. The memory devices 820 of the accelerator sled 1100 are mounted to the bottom side 850 of the of the chassis-less circuit board substrate 702 as discussed above in regard to the sled 700. Although mounted to the bottom side 850, the memory devices 820 are communicatively coupled to the accelerator circuits 1120 located on the top side 750 via the I/O subsystem 722 (e.g., through vias). Further, the accelerator circuits 1120 may include and/or be associated with a heatsink 1150 that is larger than a traditional heatsink used in a server. As discussed above with reference to the heatsinks 950 of FIG. 9, the heatsinks 1150 may be larger than traditional heatsinks because of the "free" area provided by the memory resources 820 being located on the bottom side 850 of the chassis-less circuit board substrate 702 rather than on the top side 750.

Figure 13:
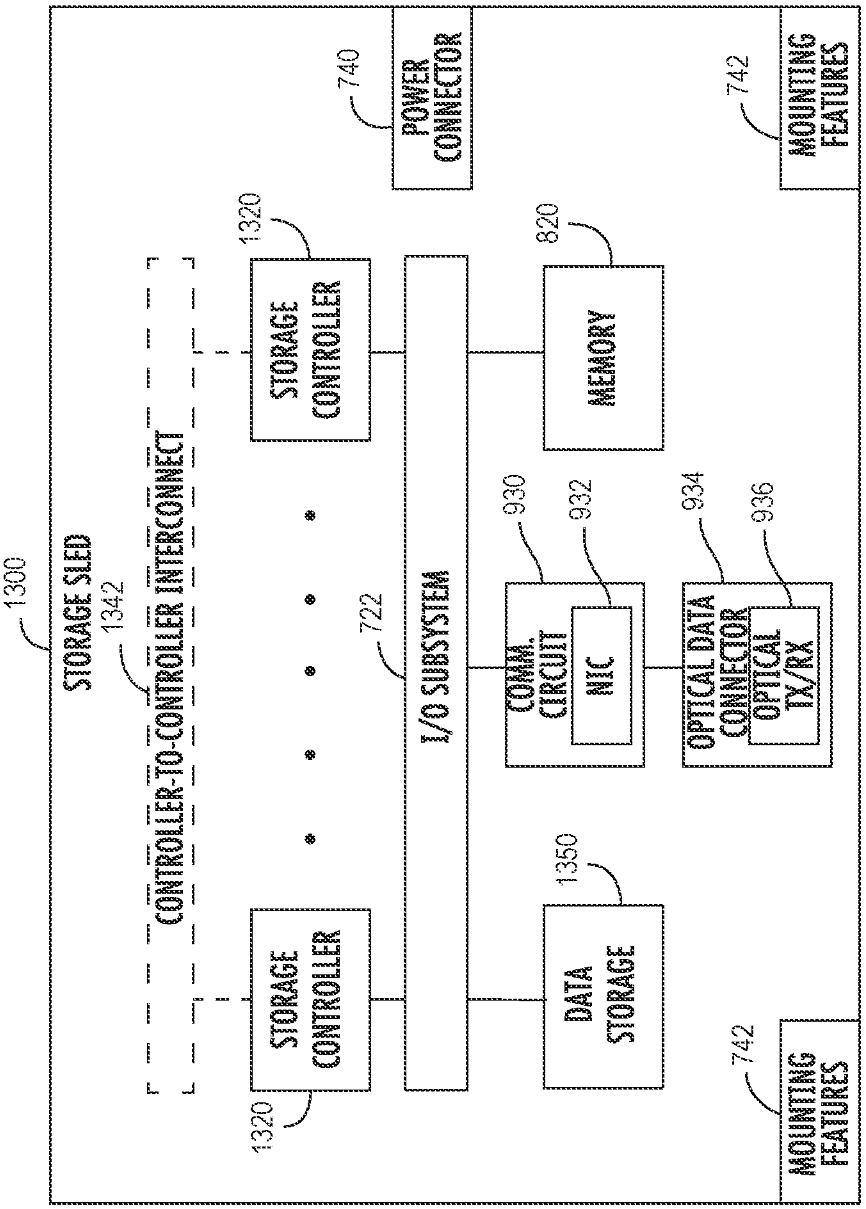
FIG. 13 is a block diagram of at least one example of a storage sled usable in the data center of FIG. 2.

Referring now to FIG. 13, in some examples, the sled 500 may be implemented as a storage sled 1300. The storage sled 1300 is configured, to store data in a data storage 1350 local to the storage sled 1300. For example, during operation, a compute sled 900 or an accelerator sled 1100 may store and retrieve data from the data storage 1350 of the storage sled 1300. The storage sled 1300 includes various components similar to components of the sled 500 and/or the compute sled 900, which have been identified in FIG. 13 using the same reference numbers. The description of such components provided above in regard to FIGS. 7, 8, and 9 apply to the corresponding components of the storage sled 1300 and is not repeated herein for clarity of the description of the storage sled 1300.

In the illustrative storage sled 1300, the physical resources 720 includes storage controllers 1320. Although only two storage controllers 1320 are shown in FIG. 13, it should be appreciated that the storage sled 1300 may include additional storage controllers 1320 in other examples. The storage controllers 1320 may be implemented as any type of processor, controller, or control circuit capable of controlling the storage and retrieval of data into the data storage 1350 based on requests received via the communication circuit 930. In the illustrative example, the storage controllers 1320 are implemented as relatively low-power processors or controllers. For example, in some examples, the storage controllers 1320 may be configured to operate at a power rating of about 75 watts.

In some examples, the storage sled 1300 may also include a controller-to-controller interconnect 1342. Similar to the resource-to-resource interconnect 724 of the sled 500 discussed above, the controller-to-controller interconnect 1342 may be implemented as any type of communication interconnect capable of facilitating controller-to-controller communications. In the illustrative example, the controller-to-controller interconnect 1342 is implemented as a high-speed point-to-point interconnect (e.g., faster than the I/O subsystem 722). For example, the controller-to-controller interconnect 1342 may be implemented as a QuickPath Interconnect (QPI), an UltraPath Interconnect (UPI), or other high-speed point-to-point interconnect dedicated to processor-to-processor communications.

Figure 14:
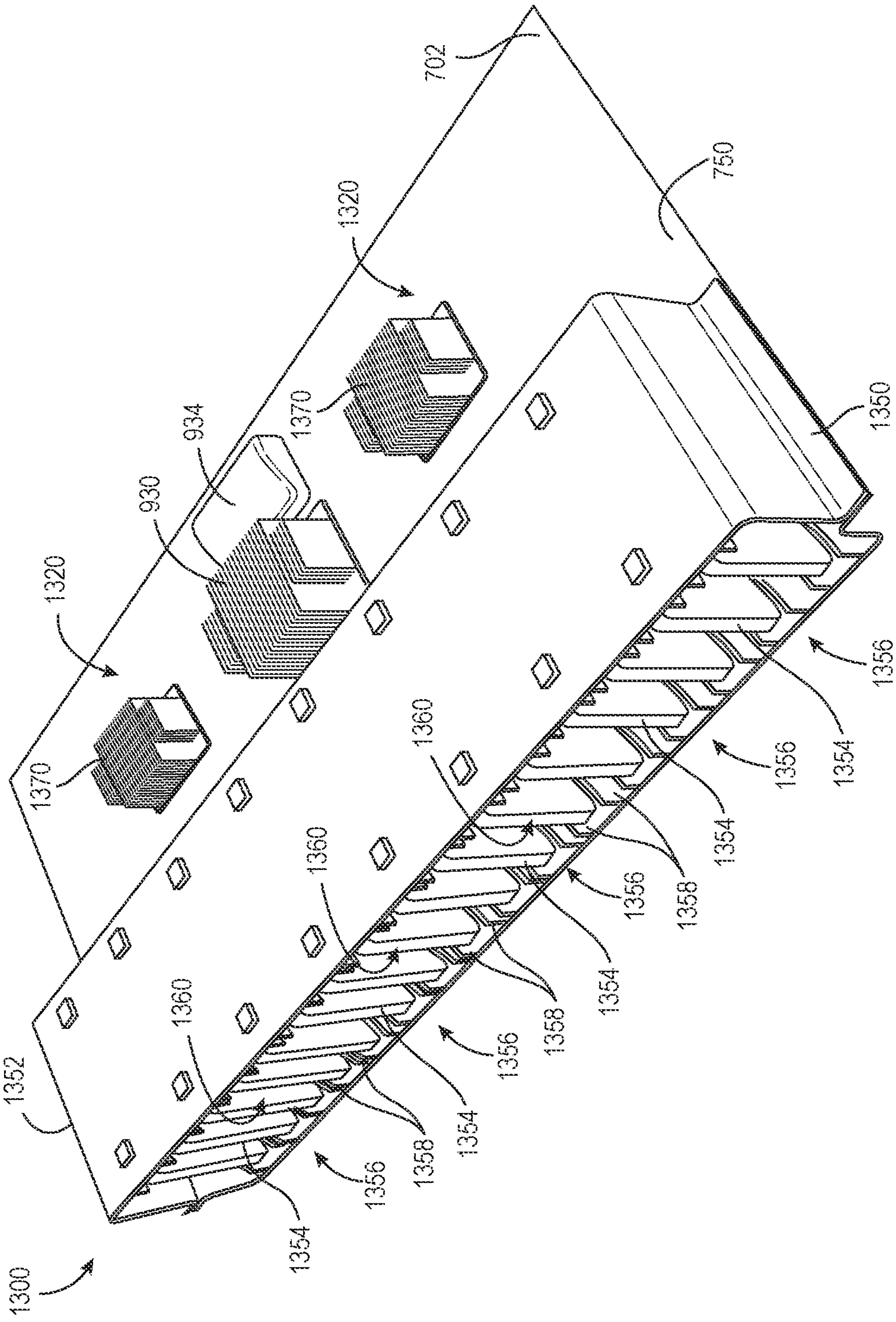
FIG. 14 is a top perspective view of at least one example of the storage sled of FIG. 13.

Referring now to FIG. 14, an illustrative example of the storage sled 1300 is shown. In the illustrative example, the data storage 1350 is implemented as, or otherwise includes, a storage cage 1352 configured to house one or more solid state drives (SSDs) 1354. To do so, the storage cage 1352 includes a number of mounting slots 1356, which are configured to receive corresponding solid state drives 1354. The mounting slots 1356 include a number of drive guides 1358 that cooperate to define an access opening 1360 of the corresponding mounting slot 1356. The storage cage 1352 is secured to the chassis-less circuit board substrate 702 such that the access openings face away from (i.e., toward the front of) the chassis-less circuit board substrate 702. As such, solid state drives 1354 are accessible while the storage sled 1300 is mounted in a corresponding rack 304. For example, a solid state drive 1354 may be swapped out of a rack 340 (e.g., via a robot) while the storage sled 1300 remains mounted in the corresponding rack 340.

The storage cage 1352 illustratively includes sixteen mounting slots 1356 and is capable of mounting and storing sixteen solid state drives 1354. The storage cage 1352 may be configured to store additional or fewer solid state drives 1354 in other examples. Additionally, in the illustrative example, the solid state drives are mounted vertically in the storage cage 1352, but may be mounted in the storage cage 1352 in a different orientation in other examples. A given solid state drive 1354 may be implemented as any type of data storage device capable of storing long term data. To do so, the solid state drives 1354 may include volatile and non-volatile memory devices discussed above.

As shown in FIG. 14, the storage controllers 1320, the communication circuit 930, and the optical data connector 934 are illustratively mounted to the top side 750 of the chassis-less circuit board substrate 702. Again, as discussed above, any suitable attachment or mounting technology may be used to mount the electrical components of the storage sled 1300 to the chassis-less circuit board substrate 702 including, for example, sockets (e.g., a processor socket), holders, brackets, soldered connections, and/or other mounting or securing techniques.

As discussed above, the individual storage controllers 1320 and the communication circuit 930 are mounted to the top side 750 of the chassis-less circuit board substrate 702 such that no two heat-producing, electrical components shadow each other. For example, the storage controllers 1320 and the communication circuit 930 are mounted in corresponding locations on the top side 750 of the chassis-less circuit board substrate 702 such that no two of those electrical components are linearly in-line with each other along the direction of the airflow path 708.

The memory devices 820 (not shown in FIG. 14) of the storage sled 1300 are mounted to the bottom side 850 (not shown in FIG. 14) of the chassis-less circuit board substrate 702 as discussed above in regard to the sled 500. Although mounted to the bottom side 850, the memory devices 820 are communicatively coupled to the storage controllers 1320 located on the top side 750 via the I/O subsystem 722. Again, because the chassis-less circuit board substrate 702 is implemented as a double-sided circuit board, the memory devices 820 and the storage controllers 1320 may be communicatively coupled by one or more vias, connectors, or other mechanisms extending through the chassis-less circuit board substrate 702. The storage controllers 1320 include and/or are associated with a heatsink 1370 secured thereto. As discussed above, due to the improved thermal cooling characteristics of the chassis-less circuit board substrate 702 of the storage sled 1300, none of the heatsinks 1370 include cooling fans attached thereto. That is, the heatsinks 1370 may be fan-less heatsinks.

Figure 15:
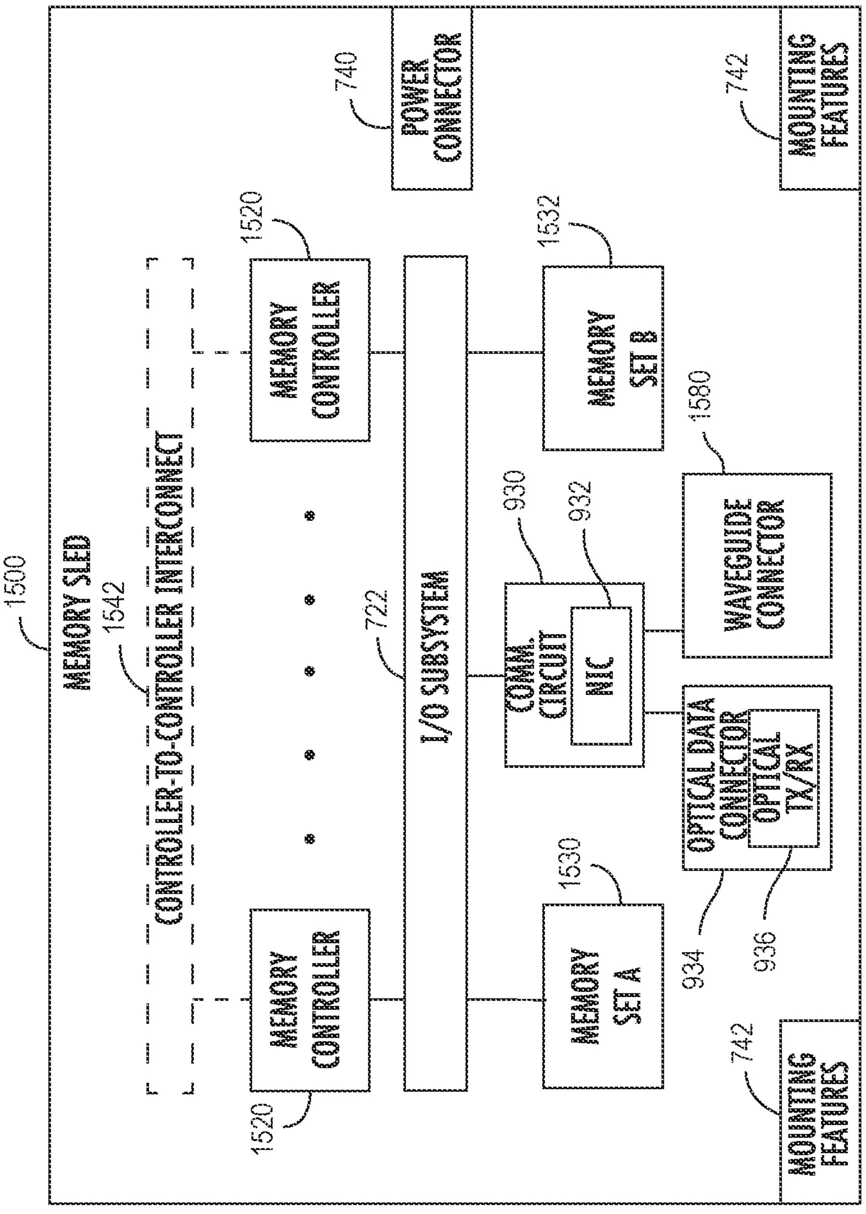
FIG. 15 is a block diagram of at least one example of a memory sled usable in the data center of FIG. 2.

Referring now to FIG. 15, in some examples, the sled 500 may be implemented as a memory sled 1500. The storage sled 1500 is optimized, or otherwise configured, to provide other sleds 500 (e.g., compute sleds 900, accelerator sleds 1100, etc.) with access to a pool of memory (e.g., in two or more sets 1530, 1532 of memory devices 820) local to the memory sled 1300. For example, during operation, a compute sled 900 or an accelerator sled 1100 may remotely write to and/or read from one or more of the memory sets 1530, 1532 of the memory sled 1300 using a logical address space that maps to physical addresses in the memory sets 1530, 1532. The memory sled 1500 includes various components similar to components of the sled 500 and/or the compute sled 900, which have been identified in FIG. 15 using the same reference numbers. The description of such components provided above in regard to FIGS. 7, 8, and 9 apply to the corresponding components of the memory sled 1500 and is not repeated herein for clarity of the description of the memory sled 1500.

In the illustrative memory sled 1500, the physical resources 720 include memory controllers 1520. Although only two memory controllers 1520 are shown in FIG. 15, it should be appreciated that the memory sled 1500 may include additional memory controllers 1520 in other examples. The memory controllers 1520 may be implemented as any type of processor, controller, or control circuit capable of controlling the writing and reading of data into the memory sets 1530, 1532 based on requests received via the communication circuit 930. In the illustrative example, the memory controllers 1520 are connected to corresponding memory sets 1530, 1532 to write to and read from memory devices 820 (not shown) within the corresponding memory set 1530, 1532 and enforce any permissions (e.g., read, write, etc.) associated with sled 500 that has sent a request to the memory sled 1500 to perform a memory access operation (e.g., read or write).

In some examples, the memory sled 1500 may also include a controller-to-controller interconnect 1542. Similar to the resource-to-resource interconnect 724 of the sled 500 discussed above, the controller-to-controller interconnect 1542 may be implemented as any type of communication interconnect capable of facilitating controller-to-controller communications. In the illustrative example, the controller-to-controller interconnect 1542 is implemented as a high-speed point-to-point interconnect (e.g., faster than the I/O subsystem 722). For example, the controller-to-controller interconnect 1542 may be implemented as a QuickPath Interconnect (QPI), an UltraPath Interconnect (UPI), or other high-speed point-to-point interconnect dedicated to processor-to-processor communications. As such, in some examples, a memory controller 1520 may access, through the controller-to-controller interconnect 1542, memory that is within the memory set 1532 associated with another memory controller 1520. In some examples, a scalable memory controller is made of multiple smaller memory controllers, referred to herein as "chiplets", on a memory sled (e.g., the memory sled 1500). The chiplets may be interconnected (e.g., using EMIB (Embedded Multi-Die Interconnect Bridge) technology). The combined chiplet memory controller may scale up to a relatively large number of memory controllers and I/O ports, (e.g., up to 16 memory channels). In some examples, the memory controllers 1520 may implement a memory interleave (e.g., one memory address is mapped to the memory set 1530, the next memory address is mapped to the memory set 1532, and the third address is mapped to the memory set 1530, etc.). The interleaving may be managed within the memory controllers 1520, or from CPU sockets (e.g., of the compute sled 900) across network links to the memory sets 1530, 1532, and may improve the latency associated with performing memory access operations as compared to accessing contiguous memory addresses from the same memory device.

Further, in some examples, the memory sled 1500 may be connected to one or more other sleds 500 (e.g., in the same rack 340 or an adjacent rack 340) through a waveguide, using the waveguide connector 1580. In the illustrative example, the waveguides are 74 millimeter waveguides that provide 16 Rx (i.e., receive) lanes and 16 Tx (i.e., transmit) lanes. Different ones of the lanes, in the illustrative example, are either 16 GHz or 32 GHz. In other examples, the frequencies may be different. Using a waveguide may provide high throughput access to the memory pool (e.g., the memory sets 1530, 1532) to another sled (e.g., a sled 500 in the same rack 340 or an adjacent rack 340 as the memory sled 1500) without adding to the load on the optical data connector 934.

Figure 16:
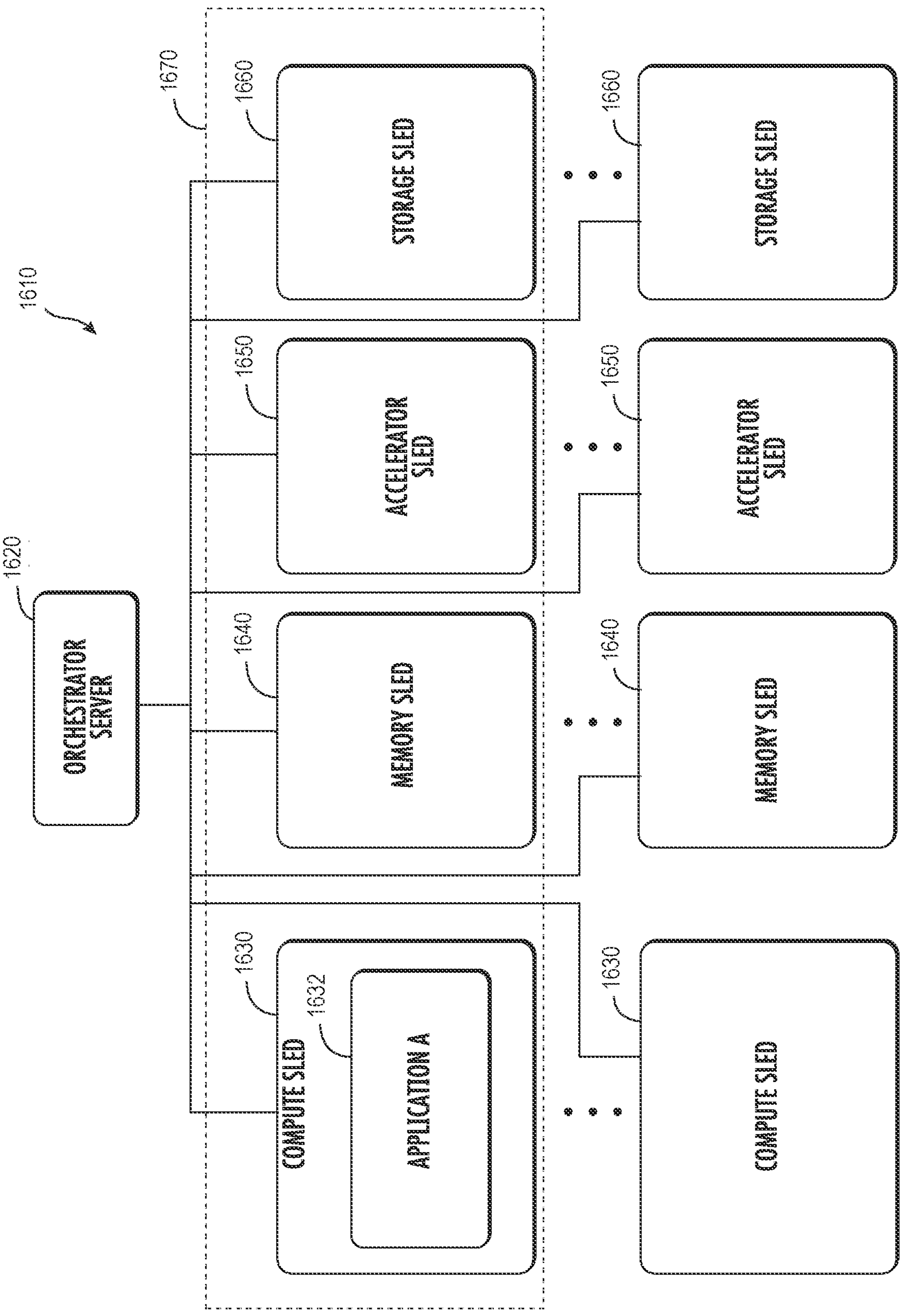
FIG. 16 is a block diagram of a system that may be established within the data center of FIG. 2 to execute workloads with managed nodes of disaggregated resources.

Referring now to FIG. 16, a system for executing one or more workloads (e.g., applications) may be implemented in accordance with the data center 200. In the illustrative example, the system 1610 includes an orchestrator server 1620, which may be implemented as a managed node including a compute device (e.g., processor circuitry 920 on a compute sled 900) executing management software (e.g., a cloud operating environment, such as OpenStack) that is communicatively coupled to multiple sleds 500 including a large number of compute sleds 1630 (e.g., similar to the compute sled 900), memory sleds 1640 (e.g., similar to the memory sled 1500), accelerator sleds 1650 (e.g., similar to the memory sled 1000), and storage sleds 1660 (e.g., similar to the storage sled 1300). One or more of the sleds 1630, 1640, 1650, 1660 may be grouped into a managed node 1670, such as by the orchestrator server 1620, to collectively perform a workload (e.g., an application 1632 executed in a virtual machine or in a container). The managed node 1670 may be implemented as an assembly of physical resources 720, such as processor circuitry 920, memory resources 820, accelerator circuits 1120, or data storage 1350, from the same or different sleds 500. Further, the managed node may be established, defined, or "spun up" by the orchestrator server 1620 at the time a workload is to be assigned to the managed node or at any other time, and may exist regardless of whether any workloads are presently assigned to the managed node. In the illustrative example, the orchestrator server 1620 may selectively allocate and/or deallocate physical resources 720 from the sleds 500 and/or add or remove one or more sleds 500 from the managed node 1670 as a function of quality of service (QoS) targets (e.g., a target throughput, a target latency, a target number of instructions per second, etc.) associated with a service level agreement for the workload (e.g., the application 1632). In doing so, the orchestrator server 1620 may receive telemetry data indicative of performance conditions (e.g., throughput, latency, instructions per second, etc.) in different ones of the sleds 500 of the managed node 1670 and compare the telemetry data to the quality of service targets to determine whether the quality of service targets are being satisfied. The orchestrator server 1620 may additionally determine whether one or more physical resources may be deallocated from the managed node 1670 while still satisfying the QoS targets, thereby freeing up those physical resources for use in another managed node (e.g., to execute a different workload). Alternatively, if the QoS targets are not presently satisfied, the orchestrator server 1620 may determine to dynamically allocate additional physical resources to assist in the execution of the workload (e.g., the application 1632) while the workload is executing. Similarly, the orchestrator server 1620 may determine to dynamically deallocate physical resources from a managed node if the orchestrator server 1620 determines that deallocating the physical resource would result in QoS targets still being met.

Additionally, in some examples, the orchestrator server 1620 may identify trends in the resource utilization of the workload (e.g., the application 1632), such as by identifying phases of execution (e.g., time periods in which different operations, having different resource utilizations characteristics, are performed) of the workload (e.g., the application 1632) and pre-emptively identifying available resources in the data center 200 and allocating them to the managed node 1670 (e.g., within a predefined time period of the associated phase beginning). In some examples, the orchestrator server 1620 may model performance based on various latencies and a distribution scheme to place workloads among compute sleds and other resources (e.g., accelerator sleds, memory sleds, storage sleds) in the data center 200. For example, the orchestrator server 1620 may utilize a model that accounts for the performance of resources on the sleds 500 (e.g., FPGA performance, memory access latency, etc.) and the performance (e.g., congestion, latency, bandwidth) of the path through the network to the resource (e.g., FPGA). As such, the orchestrator server 1620 may determine which resource(s) should be used with which workloads based on the total latency associated with different potential resource(s) available in the data center 200 (e.g., the latency associated with the performance of the resource itself in addition to the latency associated with the path through the network between the compute sled executing the workload and the sled 500 on which the resource is located).

In some examples, the orchestrator server 1620 may generate a map of heat generation in the data center 200 using telemetry data (e.g., temperatures, fan speeds, etc.) reported from the sleds 500 and allocate resources to managed nodes as a function of the map of heat generation and predicted heat generation associated with different workloads, to maintain a target temperature and heat distribution in the data center 200. Additionally or alternatively, in some examples, the orchestrator server 1620 may organize received telemetry data into a hierarchical model that is indicative of a relationship between the managed nodes (e.g., a spatial relationship such as the physical locations of the resources of the managed nodes within the data center 200 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1620 may determine the differences based on the telemetry data stored in the hierarchical model and factor the differences into a prediction of future resource utilization of a workload if the workload is reassigned from one managed node to another managed node, to accurately balance resource utilization in the data center 200. In some examples, the orchestrator server 1620 may identify patterns in resource utilization phases of the workloads and use the patterns to predict future resource utilization of the workloads.

To reduce the computational load on the orchestrator server 1620 and the data transfer load on the network, in some examples, the orchestrator server 1620 may send self-test information to the sleds 500 to enable a given sled 500 to locally (e.g., on the sled 500) determine whether telemetry data generated by the sled 500 satisfies one or more conditions (e.g., an available capacity that satisfies a predefined threshold, a temperature that satisfies a predefined threshold, etc.). The given sled 500 may then report back a simplified result (e.g., yes or no) to the orchestrator server 1620, which the orchestrator server 1620 may utilize in determining the allocation of resources to managed nodes.

Figure 17:
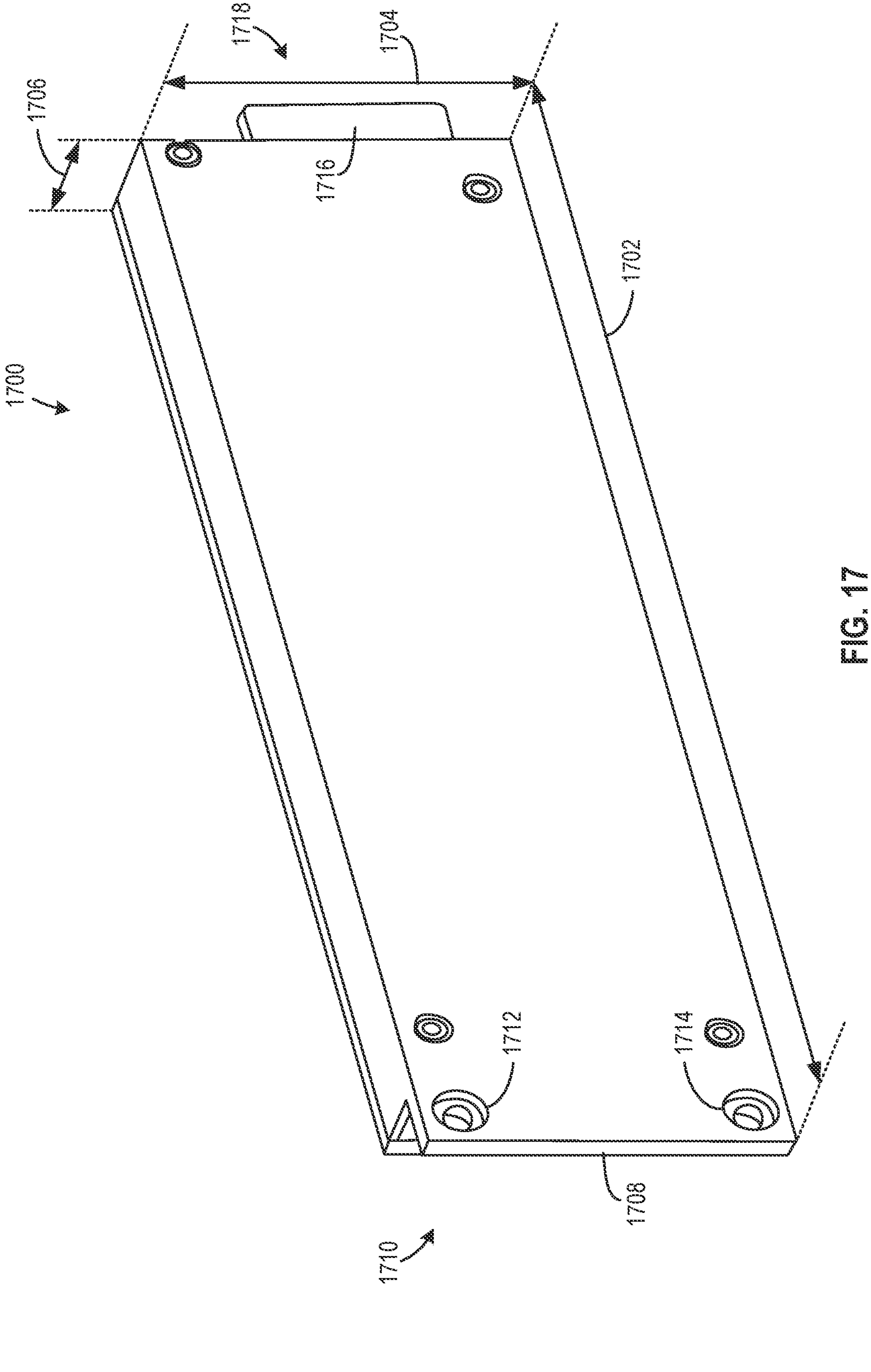
FIG. 17 is a perspective view of an example first memory device that may be mounted in an example sled.
Figure 18:
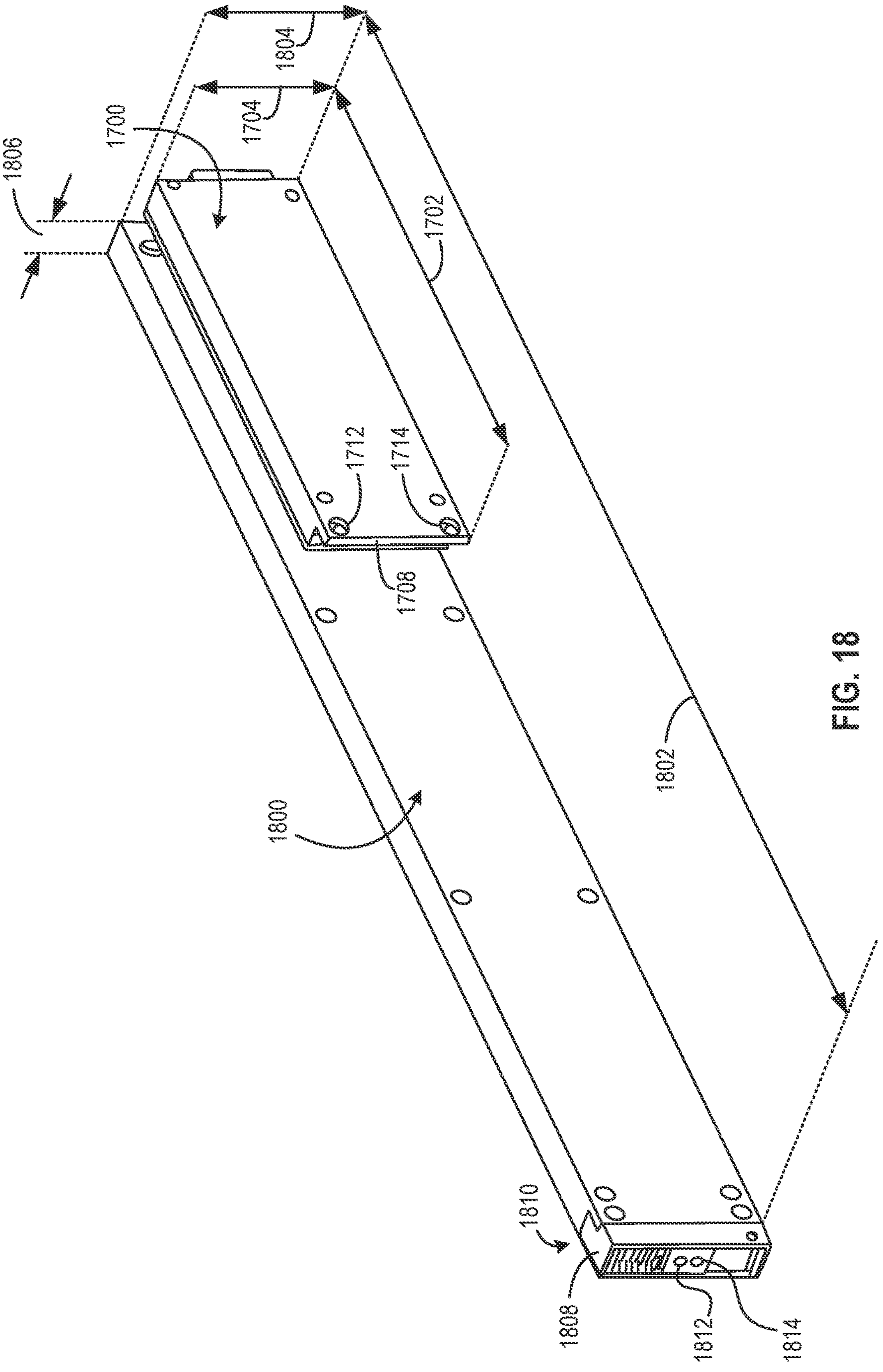
FIG. 18 is a perspective view of the example first memory device of FIG. 17 and another example second memory device that may be mounted in an example sled.

Referring now to FIG. 17, an example first memory device 1700 is shown that can be carried by an example sled (e.g., one of the memory sleds 1500 mentioned above and/or any other suitable sled) to store data. FIG. 18 shows a perspective view to compare a first form factor corresponding to the first memory device 1700 of FIG. 17 to a second form factor corresponding to a second memory device 1800. The first and second memory devices 1700, 1800 can correspond to first and second types of the solid state drives (SSDs) 1354 discussed above. In some examples, the first and second form factors are standardized sizing parameters according to Enterprise and Data Center Standard Form Factor (EDSFF) specifications. For example, the first memory device 1700 can correspond to an E1.S form factor, and the second memory device 1800 can correspond to an E1.L form factor. That is, the example first memory device 1700 has a first form factor and the second memory device 1800 has a second form factor, but the first and second form factors are compatible with a plurality of server racks (e.g., racks sized to a standard rack unit "1U," such as rack 340) and can be mounted on a variety of sleds (e.g., sled 500, storage sled 1300, etc.). Additionally, the first and second memory devices 1700, 1800 can be mounted in the mounting slots 1356 of the storage cage 1352 shown in FIG. 14.

Figure 19:
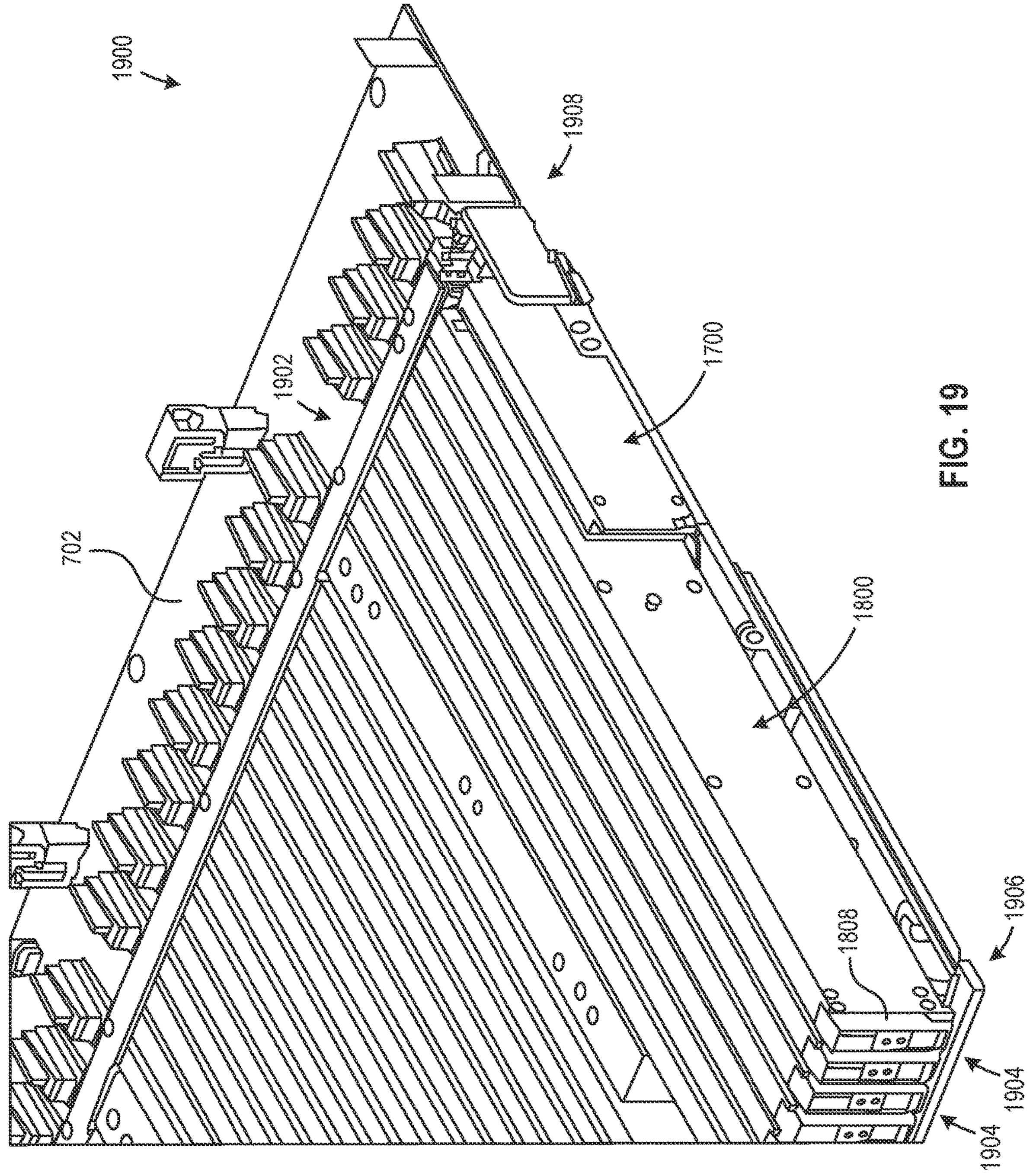
FIG. 19 is a perspective view of an example sled including the first and second memory devices of FIGS. 17 and 18 mounted therein.

FIG. 19 is a perspective view of an example sled 1900 including an example storage cage 1902 to mount and/or support the first and second memory devices 1700, 1800. The example sled 1900 can correspond to any of the sleds 500, 900, 1100, 1300, 1500 supported in the rack 340 within the data center 202 of FIG. 2. Additionally or alternatively, the example sled 1900 can correspond to any other sled supported on any other rack and/or cooled in any other suitable system (e.g., any one of the data centers 102, 106, 116 and/or building(s) 110 of FIG. 1. As shown in FIG. 19, the first and second memory devices 1700, 1800 are affixed or positioned in mounting slots or drive bays 1904 within the storage cage 1902 of the sled 1900 and communicatively coupled to circuitry integrated therein. Furthermore, the storage cage 1902 illustrated in FIG. 19 includes an exposed upper portion unlike the storage cage 1352 illustrated in FIG. 14. However, in some examples, the storage cage 1902 includes a partition to cover the upper surfaces of the first and second memory device 1700, 1800 and other memory devices disposed therein.

As represented in FIG. 17, the first memory device 1700 includes a length 1702, a width (or height) 1704, and a thickness 1706 that define the first form factor. The first memory device also includes a tab 1708 protruding from a front end 1710 of the first memory device 1700. The tab 1708 includes a first through hole 1712 and a second through hole 1714 to align fasteners (e.g., screws) with threaded holes in connected parts described in further detail below. The first and second through holes 1714, and other example through holes described below, also interface with the fasteners and, in some examples, include chamfered or beveled edges. The first memory device 1700 also includes an example male connector 1716 positioned on a rear end 1718 to electronically couple the first memory device 1700 to the sled 1900 via a female port. Although not shown, the second memory device 1800 also includes a male connector substantially similar to the male connector 1716 of the first memory device 1700. Furthermore, the first memory device 1700 includes a first light emitting diode (LED) light and a second LED light (not shown) on the front end 1710. In some examples, the first LED light is a green LED light configured to illuminate when the first memory device 1700 is active and/or functions correctly. In some examples, the second LED light is an amber LED light to illuminate when the first memory device 1700 is inactive and/or functions incorrectly.

As represented in FIG. 18, the second memory device 1800 includes a length 1802, a width (or height) 1804, and a thickness 1806 that define a second form factor. As mentioned, the first and second form factors are standardized to EDSFF specifications and, in some examples, are both capable of fitting within the standard rack unit "1U." In some examples, the length 1802 is approximately 318.75 millimeters (mm), the width 1804 is approximately 38.4 mm, and the thickness 1806 is within a range from approximately 9.5 mm to approximately 18 mm (e.g., 9.5 mm, 12 mm, 18 mm, etc.). In some examples, the length 1702 is within a range from approximately 111.49 mm to approximately 118.75 mm, the width 1704 is within a range from approximately 31.5 mm to approximately 33.75 mm, and the thickness 1706 is within a range from approximately 5.9 mm to approximately 25 mm.

As illustrated in FIGS. 18 and 19, the second memory device 1800 includes an example latch 1808 attached to a front end 1810 of the second memory device 1800 to mount and/or fixedly lock the second memory device 1800 within a particular one of the mounting slots 1904. More specifically, the latch 1808 connects to a front side 1906 of the sled 1900 to inhibit movement or shifting of the second memory device 1800 while supported in the particular one of the mounting slots 1904. In some examples, a differently sized latch of the same configuration as the latch 1808 can be attached to the tab 1708 of the first memory device 1700 via the first and second through holes 1712, 1714. However, in such examples, when the latch 1808 is attached to the front end 1710, and when the male connector 1716 is connected to the sled 1900, the latch 1808 cannot connect to the front side 1906 due to the length 1702 of the first memory device 1700 being shorter than the length 1802 of the second memory device 1800. Therefore, the latch 1808 on its own cannot sufficiently mount and/or fixedly lock the first memory device 1700 within a particular one of the mounting slots 1904. In other words, although the thickness 1706 of the first memory device 1700 and the thickness 1806 of the second memory device are different and/or can vary, the first memory device 1700 could be mounted in the mounting slot 1904 if not for the different lengths 1702, 1802 of the memory devices 1700, 1800.

As illustrated in FIG. 18, the latch 1808 includes a first window 1812 and a second window 1814 to direct light emission outward from the LED lights positioned on the front end 1810 of the second memory device 1800. The first window 1812 is to permit light (e.g., green light) from the first LED light, and the second window is to permit light (e.g., amber light) from the second LED light. When the latch 1808 or another latch substantially similar to the latch 1808 is attached to the front end 1710 of the first memory device 1700, lights from first and second LEDs can pass through the first and second windows 1812, 1814, respectively.

In some examples, the storage cage 1902 and the mounting slots 1904 are designed to support memory devices (e.g., the second memory device(s) 1800) corresponding to the E1.L form factor. Even if the first memory device 1700 is desired to be included in the example sled 1900, installation of the first memory device 1700 independently (without example mounting adaptor assemblies disclosed herein) in the mounting slot 1904 is not feasible. Since the male connector 1716 is to be connected to a female port proximal to a rear side 1908 of the sled 1900, the first memory device 1700 is to traverse approximately the length 1802 into the mounting slot 1904 to be properly installed. However, as mentioned previously, the latch 1808 may not be able to properly fix the first memory device 1700 within one of the mounting slots 1904 when the male connector 1716 is connected to the female port at the rear side 1908 of the sled 1900.

As discussed previously, cooling systems, such as the fan array 470 and the cooling fans 472, can be positioned on an example rack (e.g., rack 340) to direct cooling air toward and across an example sled (e.g., the sled 1900) mounted on the example rack. As such, the cooling air can flow from the rear side 1908, through the storage cage 1902, and toward the front side 1906 to prevent the first and second memory devices 1700, 1800 from overheating and/or becoming damaged due to excessive operating temperatures. In some examples, the storage cage 1902 is designed with an internal height that provides minimal clearance between an upper surface of the second memory device 1800 and an upper partition of the storage cage 1902. In other words, the width 1804 of the second memory device 1800 can define the internal height of the storage cage 1902 such that the distance between the upper surface of the second memory device 1800 and the upper partition of the storage cage 1902 is relatively small (e.g., 1 mm, 3 mm, 5 mm, etc.). In some examples, the distances between side surfaces of adjacent memory devices (e.g., the first and second memory devices 1700, 1800) are greater than the distance between the upper surface of the second memory device 1800 and the upper partition of the storage cage 1902. Furthermore, when air pressure builds at the rear side 1908 (behind the memory devices) of the sled 1900, the cooling air flows toward the front side 1906 via a path of least resistance (the largest opening, space, channel, etc.). Thus, when the cooling air flows through the storage cage 1902, the air is directed to the side surfaces of the example first and second memory devices 1700, 1800 to increase the surface area interaction with the cooling air and to increase heat transfer to the cooling air.

In some examples, when the first memory device 1700 is mounted in the sled 1900, a gap between an upper surface of the first memory device 1700 and the upper partition of the storage cage 1902 is relatively large (e.g., 15 mm, 25 mm, 50 mm, etc.) due to the smaller width 1704 of the first memory device 1700 relative to the large width 1804 of the second memory device 1800. As a result, the gap above the upper surface of the first memory device 1700 may become a path of least resistance for the cooling air. As such, a portion of the cooling air is directed toward this gap rather than between the mounted memory devices. Thus, when the first memory device 1700 is mounted in the sled 1900, the effectiveness of the example cooling system is diminished.

Examples disclosed herein include mounting adaptor assemblies to support smaller memory devices (e.g., the first memory devices 1700) on sleds (e.g., the sled 1900) having drive bays (e.g., the slots 1904) dimensioned to support larger memory devices (e.g., the second memory devices 1800). Example mounting adaptor assemblies disclosed herein can attach to the front end 1710 and the upper surface of the first memory device 1700 to substantially convert the first form factor of the first memory device 1700 to the second form factor of the second memory device 1800. As such, the sled 1900 does not have to be retooled and/or redesigned to support the first form factor of the first memory device 1700. Furthermore, the first memory device 1700 can be interchangeably utilized in systems (e.g., the sled 1900) designed for the second form factor (e.g., of the second memory device 1800) or systems designed for the first form factor (e.g., of the first memory device 1700), such as in other sleds smaller than the sled 1900. Thus, example mounting adaptor assemblies disclosed herein can enable a technician, operator, etc. to install the first memory device 1700 in the mounting slot 1904 with relative ease. Example mounting adapter assemblies disclosed herein can ensure that the first memory device 1700 is properly mounted and/or fixedly locked within a particular one of the mounting slots 1904 via a connection between the latch 1808 and the front side 1906 of the sled 1900. Example mounting adaptor assemblies disclosed herein can also enable the first and second LEDs to be observable at the front side 1906 of the sled 1900 without obstruction. Furthermore, example mounting adaptor assemblies disclosed herein can fill the gap between the upper surface of the first memory device 1700 and the upper partition of the storage cage 1902 such that the cooling air is directed toward the sides of the memory devices mounted therein. Lastly, example mounting adaptor assemblies disclosed herein provide additional data storage flexibility to satisfy a variety of server systems since different combinations of the first and second memory devices 1700, 1800 can be freely utilized in different sleds.

Figure 20:
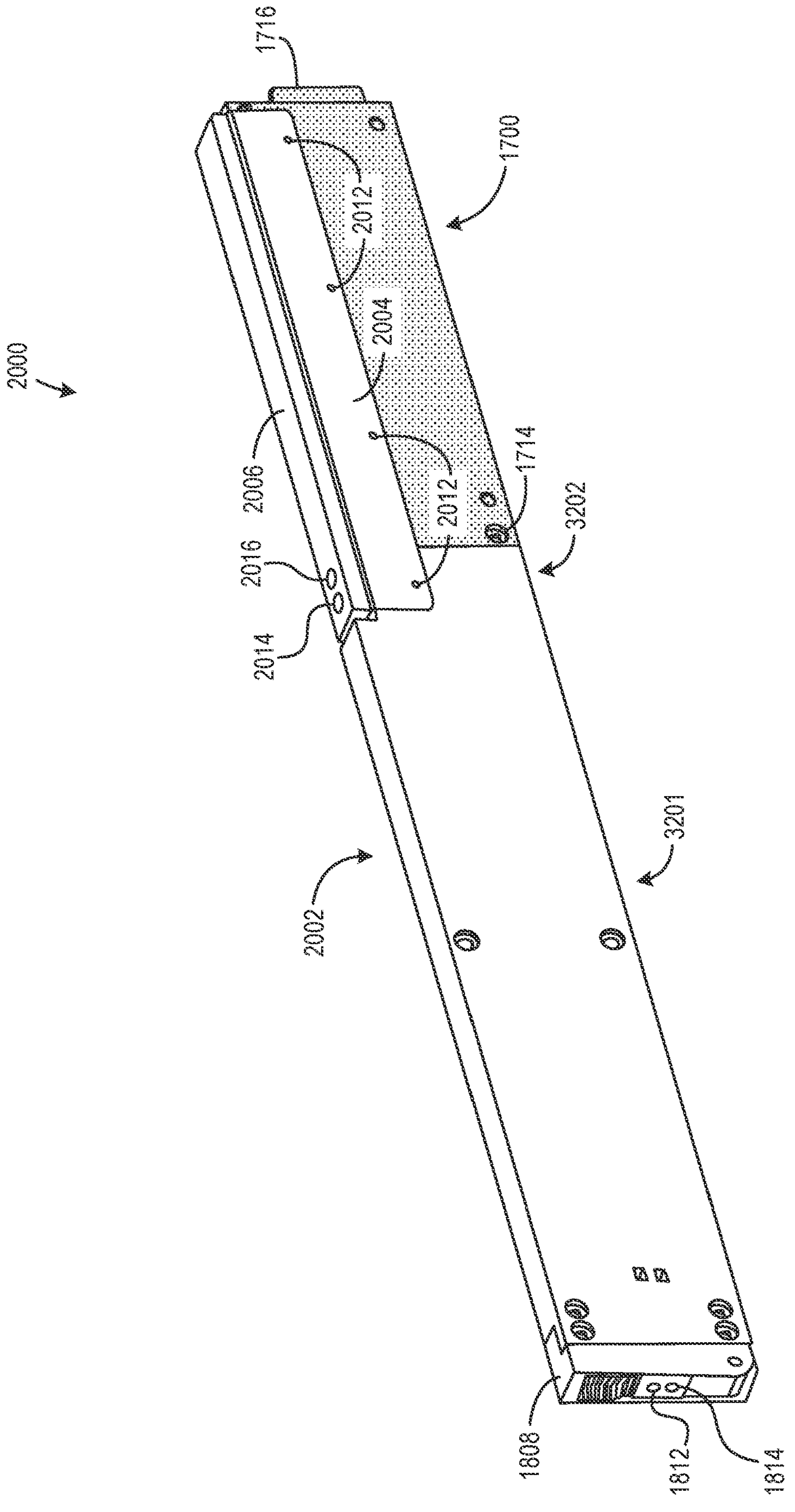
FIG. 20 is a first perspective view of an example mounting adaptor assembly to support the example first memory device of FIG. 17 in the example sled of FIG. 19 in accordance with teachings disclosed herein.
Figure 21:
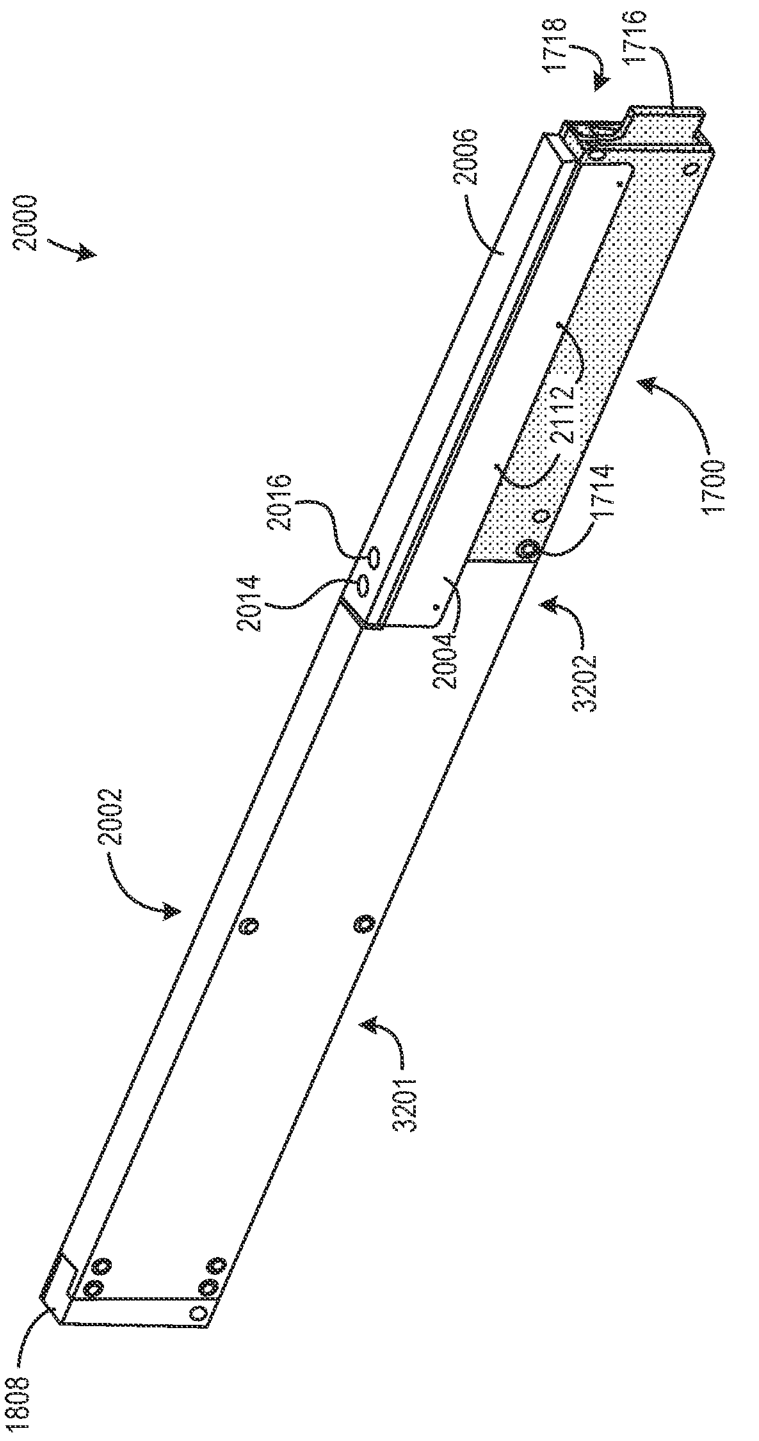
FIG. 21 is a second perspective view of the example mounting adaptor assembly of FIG. 20.
Figure 22:
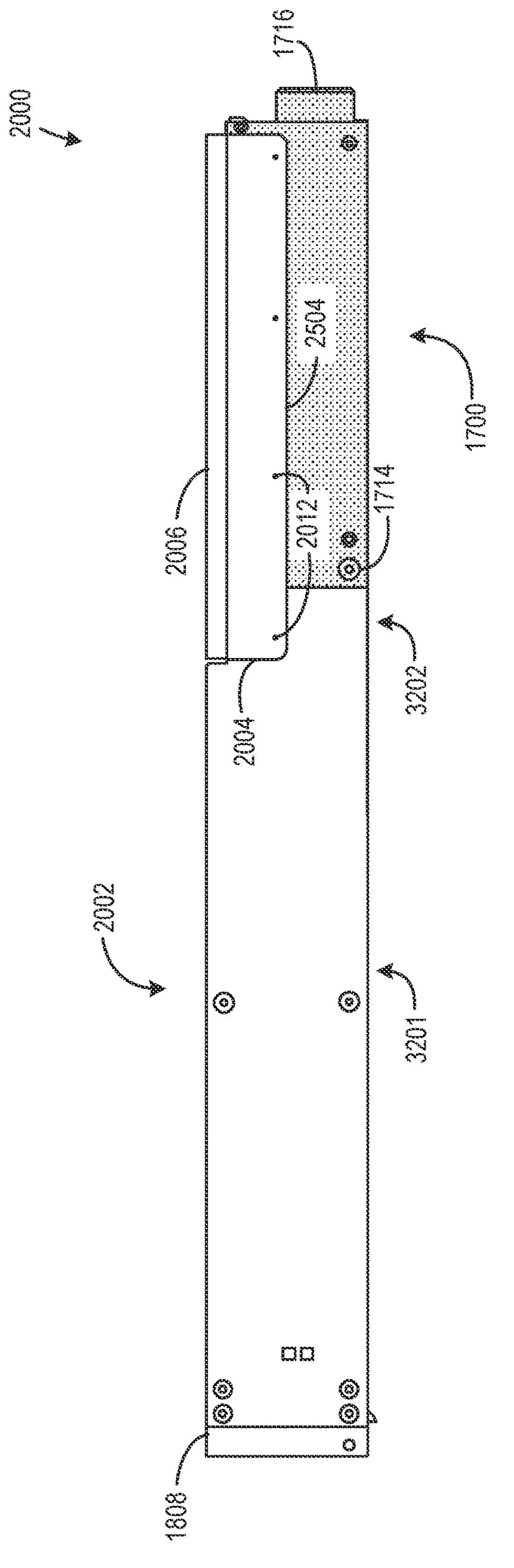
FIG. 22 is a right side view of the example mounting adaptor assembly of FIG. 20.
Figure 23:
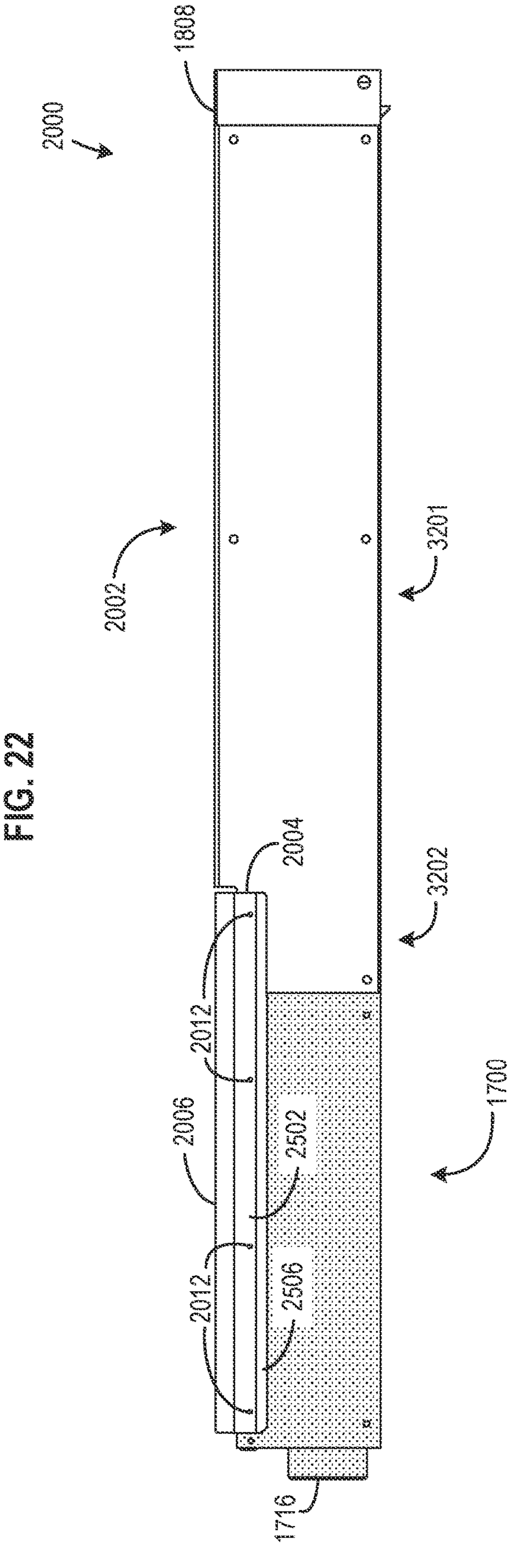
FIG. 23 is a left side view of the example mounting adaptor assembly of FIG. 20.
Figure 24:
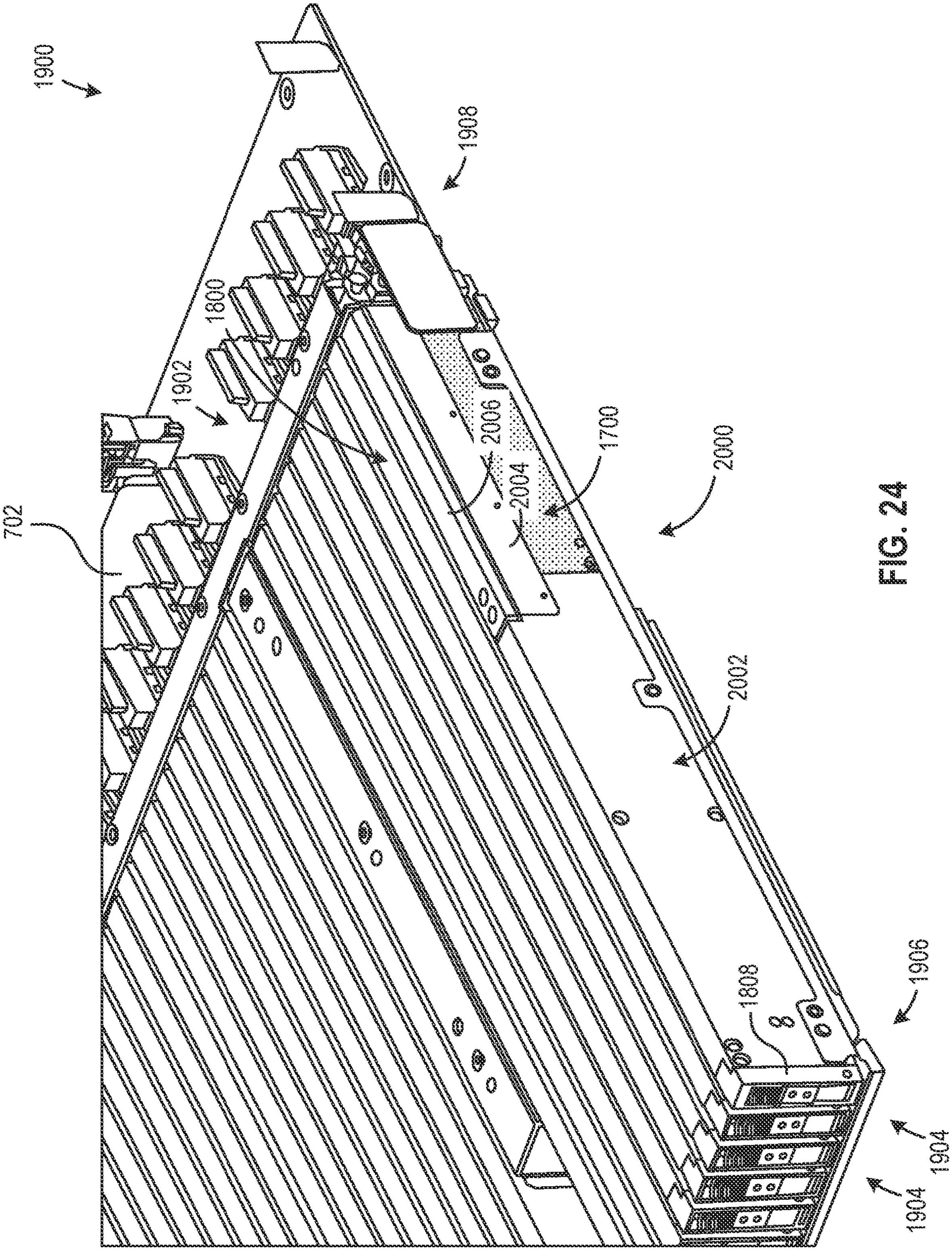
FIG. 24 is a perspective view of the example sled of FIG. 19 including the example mounting adaptor assembly of FIG. 20 mounted therein.
Figure 26:
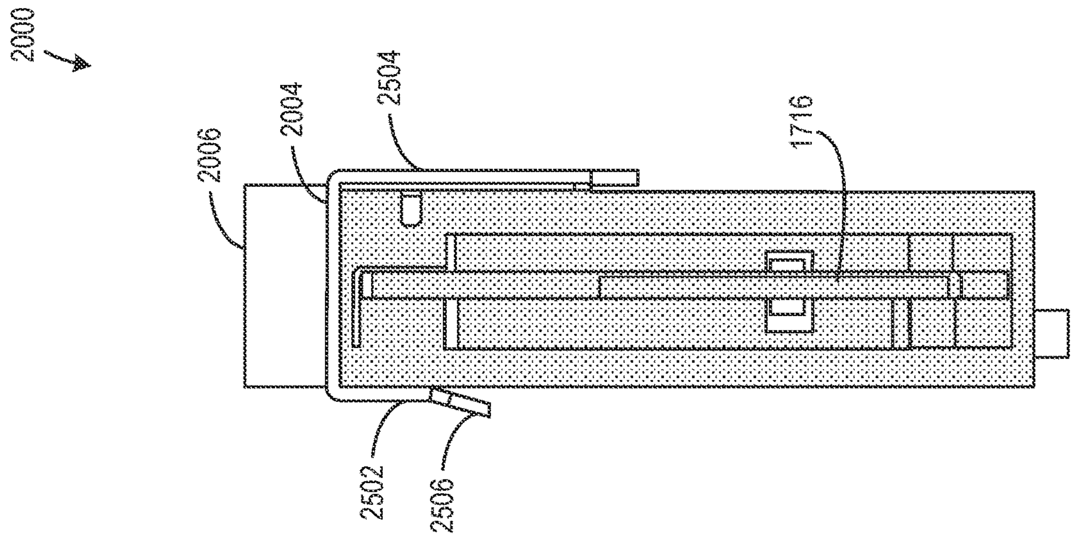
FIG. 26 is a rear view of the example mounting adaptor assembly of FIG. 20.
Figure 25:
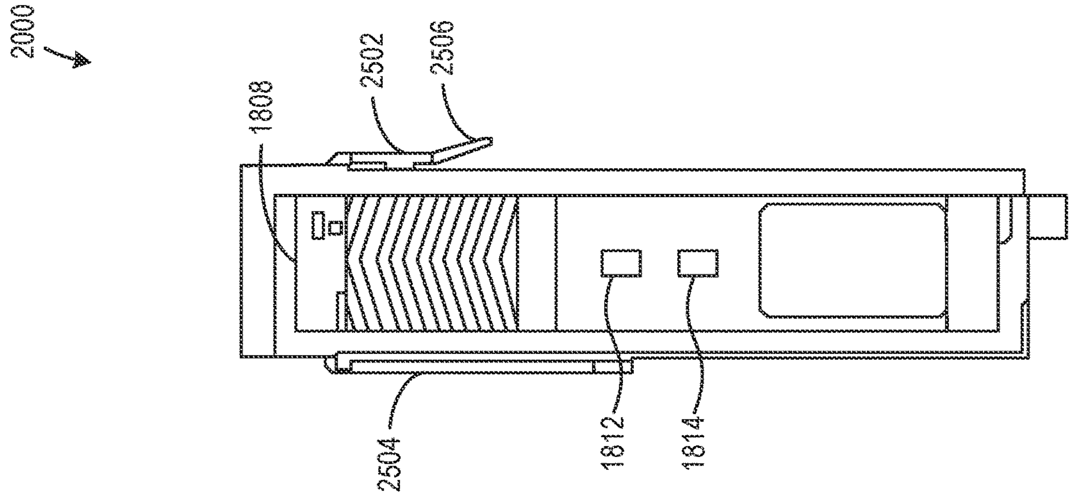
FIG. 25 is a front view of the example mounting adaptor assembly of FIG. 20.
Figure 27:
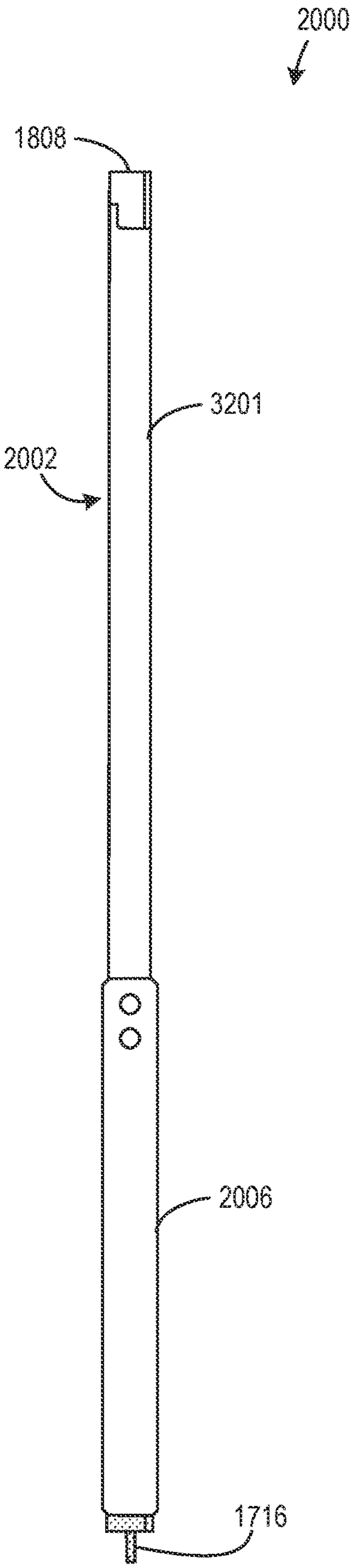
FIG. 27 is a top view of the example mounting adaptor assembly of FIG. 20.
Figure 28:
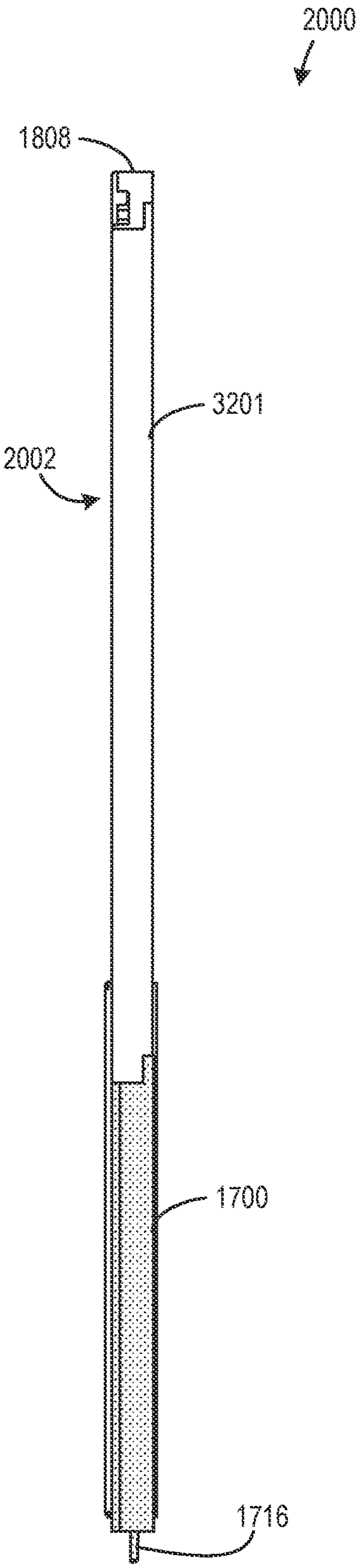
FIG. 28 is a bottom view of the example mounting adaptor assembly of FIG. 20.
Figure 30:
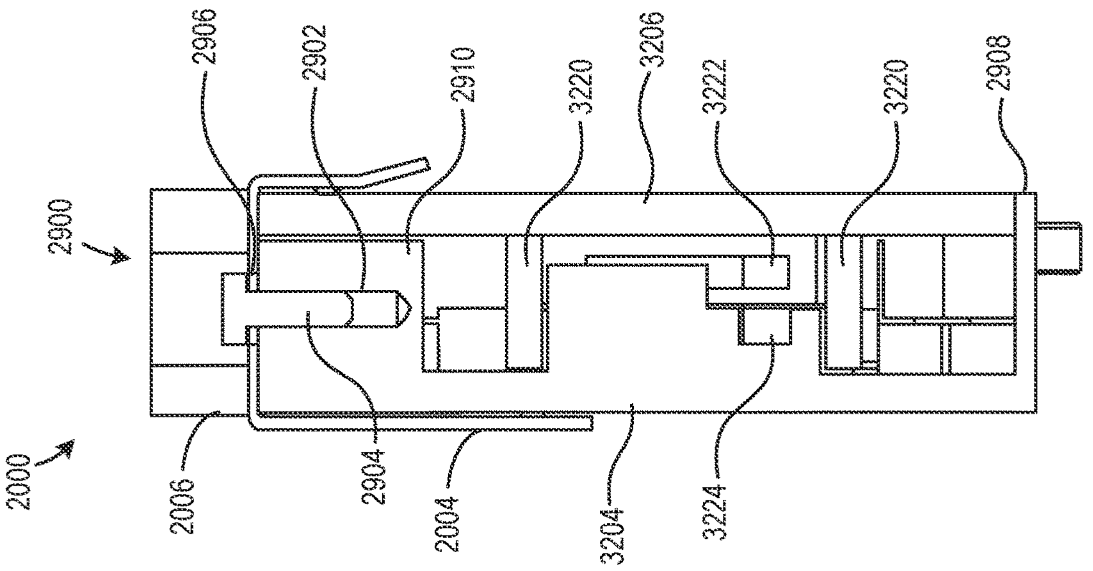
FIG. 30. is a rear view of the first cross section of FIG. 29.
Figure 29:
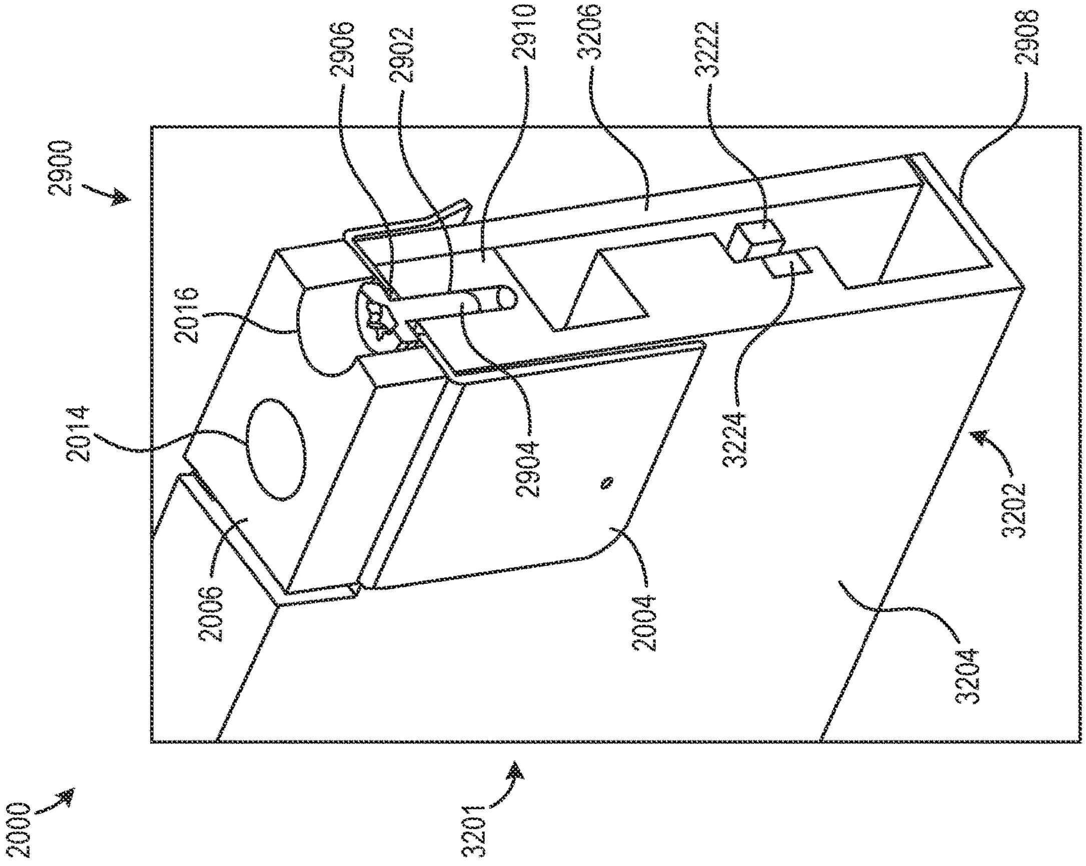
FIG. 29 is a perspective view of a first cross section of the example mounting adaptor assembly of FIG. 20.
Figure 31:
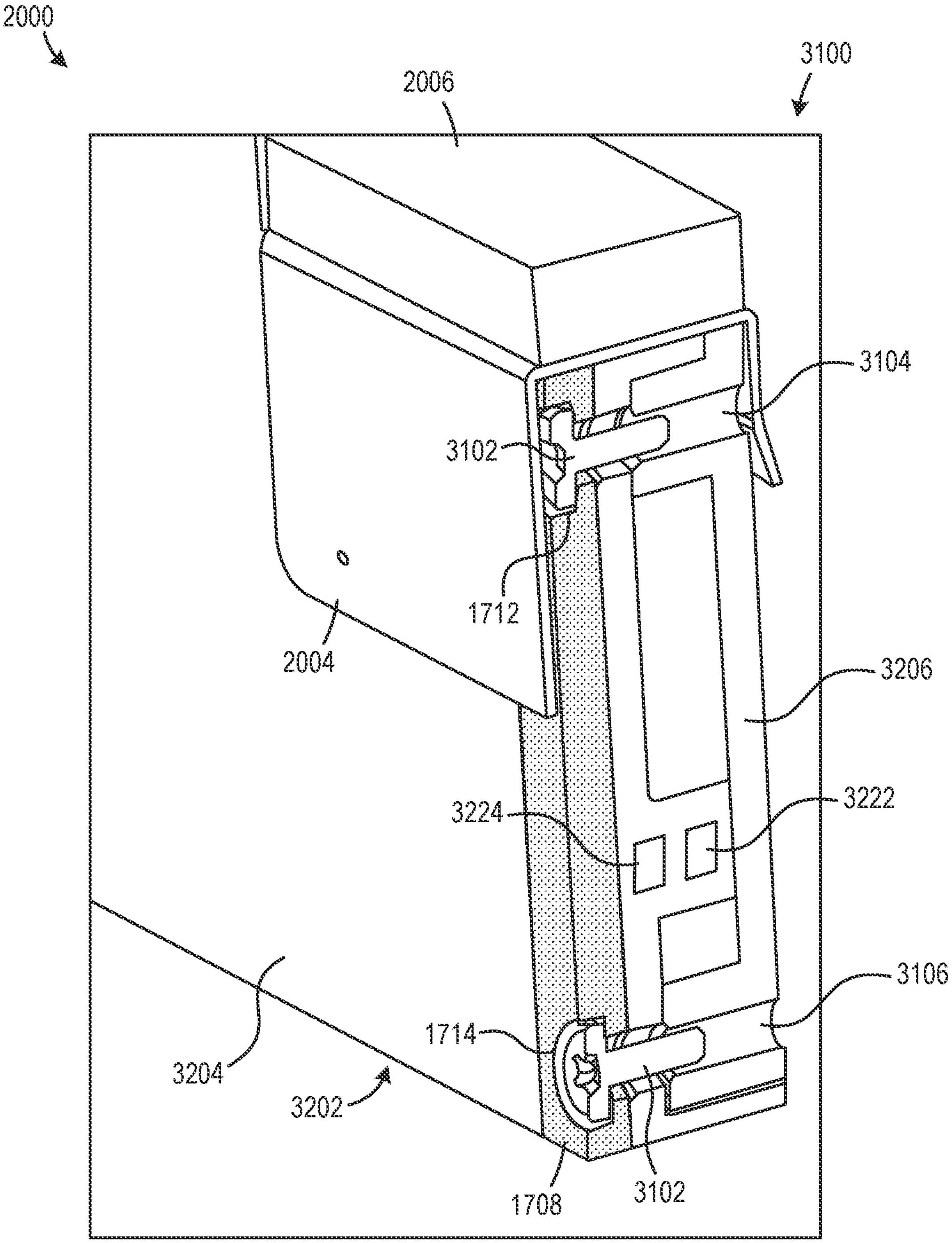
FIG. 31 is a perspective view of a second cross section of the example mounting adaptor assembly of FIG. 20.
Figure 32:
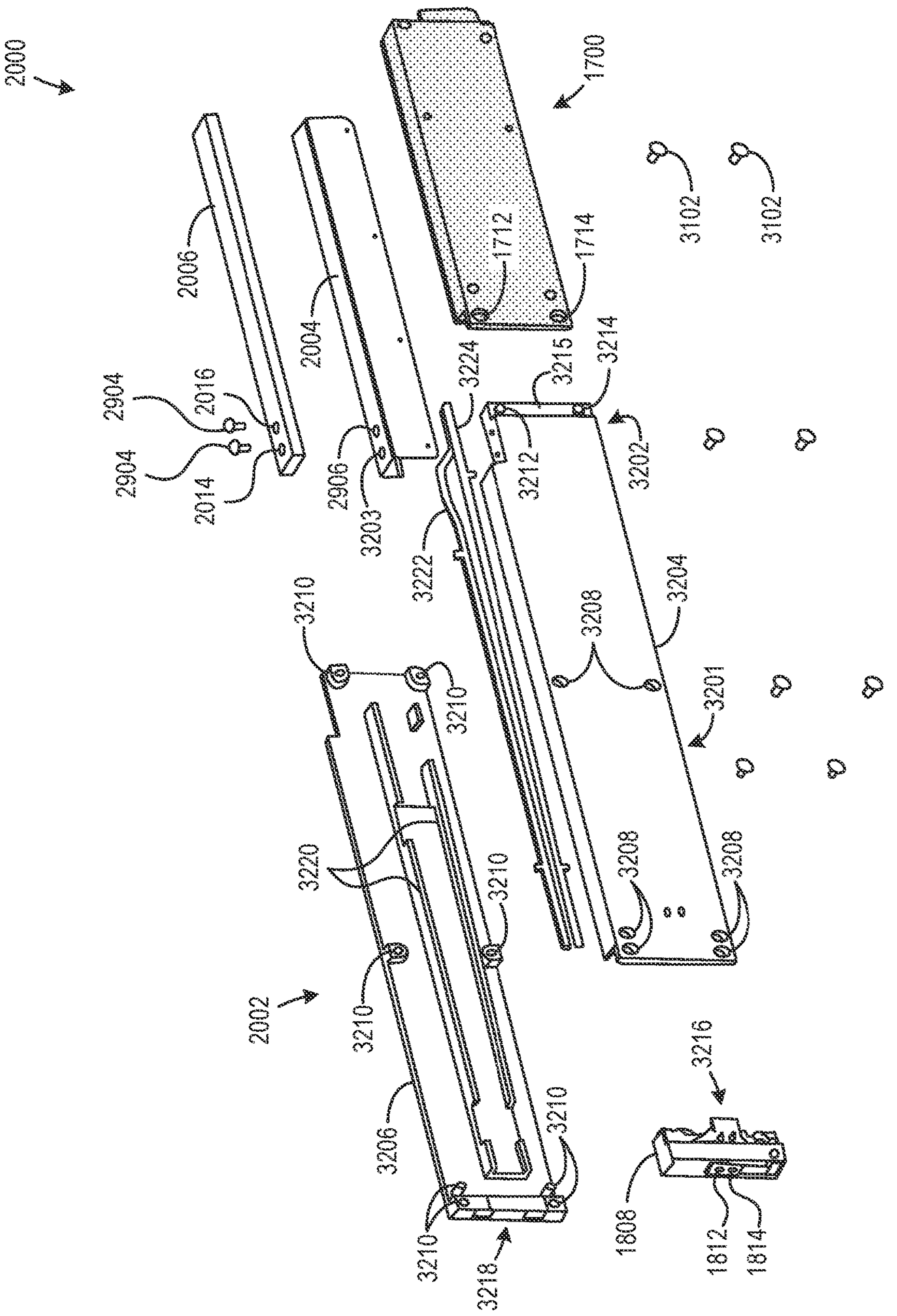
FIG. 32 is a perspective exploded view of the example mounting adaptor assembly of FIG. 20.
Figure 33:
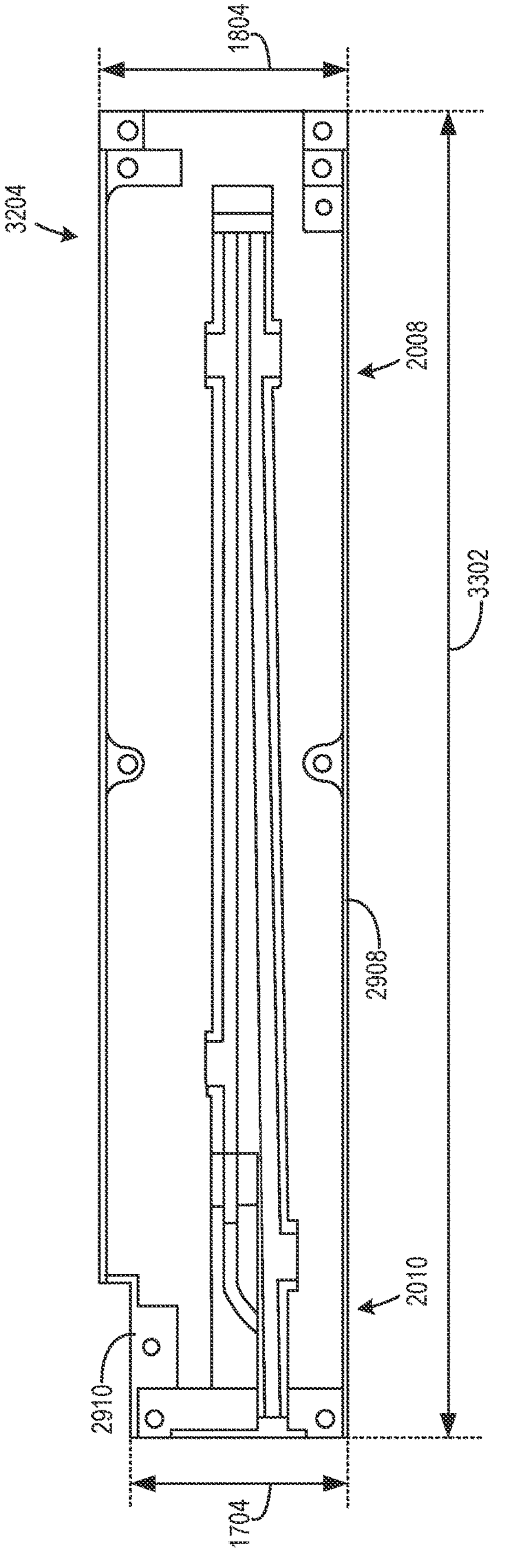
FIG. 33 is an internal side view of an example first plate of an example extender of the mounting adaptor assembly of FIG. 20.
Figure 34:
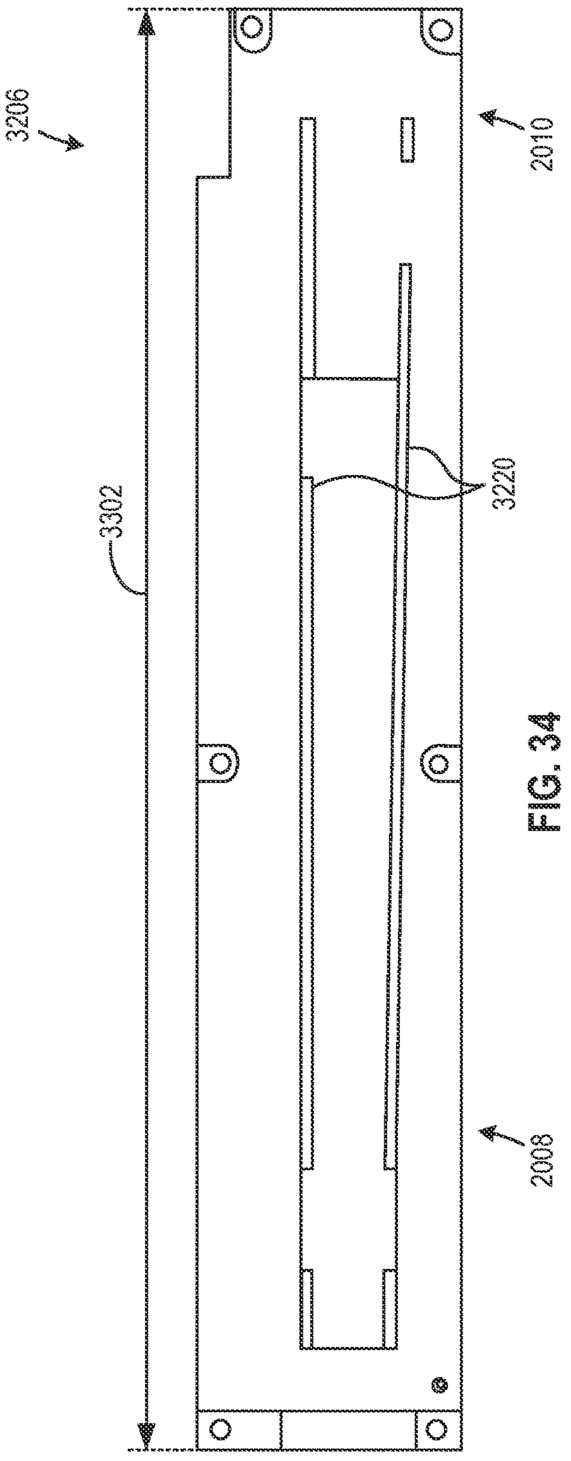
FIG. 34 is an internal side view of an example second plate of the example extender of the mounting adaptor assembly of FIG. 20.

Referring now to FIG. 20, an example mounting adaptor assembly 2000 (including the first memory device 1700) is illustrated from a first perspective view. FIG. 21 is an illustration of the example mounting adaptor assembly 2000 from a second perspective view, FIG. 22 is an illustration of the example mounting adaptor assembly 2000 from a right side view, and FIG. 23 is an illustration of the example mounting adaptor assembly 2000 from a left side view. FIG. 24 is an illustration of a perspective view of the example sled 1900 with the example mounting adaptor assembly 2000 mounted therein alongside the second memory devices 1800. FIG. 25 is an illustration of a front view of the example mounting adaptor assembly 2000, FIG. 26 is an illustration of a rear view of the example mounting adaptor assembly 2000, FIG. 27 is an illustration of a top view of the example mounting adaptor assembly 2000, and FIG. 28 is an illustration of a bottom view of the example mounting adaptor assembly 2000. FIG. 29 is a perspective view of a first cross section 2900 of the example mounting adaptor assembly 2000, FIG. 30 is a rear view of the first cross section 2900 of FIG. 29, and FIG. 31 is a perspective view of a second cross section 3100 of the example mounting adaptor assembly 2000. FIG. 32 is a perspective exploded view of the mounting adaptor assembly 2000. FIG. 33 is an internal side view of an example first plate of an example extender of the mounting adaptor assembly 2000, and FIG. 34 is an internal side view of an example second plate of the example extender of the mounting adaptor assembly 2000. For purposes of explanation, the first memory device 1700 is shaded in FIGS. 20-32 to distinguish the memory device from the other components in the example mounting adaptor assembly 2000.

The mounting adaptor assembly 2000 includes an extender 2002, a bracket 2004, and a cover 2006. The extender 2002 is an example means for extending the length 1702 of the first memory device 1700. The bracket 2004 is an example means for securing the first memory device 1700 to the extender 2002 (e.g., the extending means) in elongate alignment. As shown most clearly in FIG. 32, the extender 2002 includes a main structure, frame, or body 3201 and a tab 3202. The tab 3202 protrudes from the body 3201 and is dimensioned to a width (or height) that is less than that of the body 3201 to enable interfacing with the first memory device 1700 and to provide clearance for the bracket 2004 and the cover 2006 (described below). The extender 2002 has a length extending between opposite first and second ends. The body 3201 has a first width (or height) along a first portion of the length of the extender 2002, the tab 3202 has a second width (or height) along a second portion of the length of the extender 2002, and the first width is greater than the second width. Thus, the body 3201 and the tab 3202 are defined and/or delineated by this change from the first width to the second width along the length of the extender 2002.

As shown in FIG. 31, the tab 3202 of the extender 2002 attaches to the tab 1708 of the first memory device 1700 via fasteners 3102 (e.g., screws, bolts, etc.) located in the first and second through holes 1712, 1714. The fasteners 3102 are an example means for fastening the extender 2002 to the first memory device 1700. As shown in FIG. 31, an example first threaded hole 3104 and an example second threaded hole 3106 are positioned in the tab 3202 to secure the fasteners 3102 and to couple the tab 3202 of the extender 2002 to the tab 1708 of the first memory device 1700.

The extender 2002 is dimensioned to make up a difference between the first form factor and the second form factor to enable the first memory device 1700 to be supported in one of the mounting slots 1904 designed to receive memory devices having the second form factor. In some examples, and as illustrated in FIG. 24, the upper surface of the body 3201 of the extender 2002 is aligned with upper surface(s) of adjacent second memory device(s) 1800 mounted in the mounting slot(s) 1904. As described below with reference to FIGS. 33 and 34, the width of the body 3201 of the extender 2002 is substantially similar to the width 1804 of the second memory device 1800 of FIG. 18. As used in this context, the phrase "substantially similar" means any difference in dimensions is less than 0.25 inches. In some examples, the upper surface of the tab 3202 of the extender 2002 is aligned with the upper surface(s) of the tab 1708 and the first memory device 1700. In some examples, the alignment of the surfaces is sufficient to make the surfaces substantially flush (e.g., within +/−0.10 in). However, in other examples, the alignment may not be substantially flush (e.g., within +/−0.25 in, within +/−0.5 in, etc.). In some examples, the upper surfaces of the tab 3202 and the tab 1708 may be more aligned near proximate edges of the surfaces and less aligned at points farther apart due to the shape and/or orientation of the surfaces (e.g., tapered surfaces, non-planar surfaces, etc.). In some other examples, the upper surface of the tab 3202 is offset and/or misaligned with the upper surface(s) of the first memory device 1700. In some such examples, the upper surfaces of the tab 3202 and/or the first memory device 1700 can be tapered, curved, or angled to some degree(s) relative to each other. For example, the upper surface of the tab 3202 can slope downward and/or upward toward and/or away from the first memory device 1700.

In some examples, opposing surfaces of the extender 2002 are aligned with opposing surfaces of the first memory device 1700 when the first memory device 1700 is fastened to the tab 3202. That is, in some examples, left and right surfaces of the extender 2002 are in alignment with respect to corresponding left and right surfaces of the first memory device 1700 in the mounting adapter assembly 2000 such that the surfaces are substantially flush (e.g., withing+/−0.10 in). However, in some other examples, the opposing surfaces and/or portions of the opposing surfaces of the extender 2002 are misaligned and/or not substantially flush (e.g., within +/−0.25 in, within +/−0.50 in, etc.) with the opposing surfaces of the first memory device 1700. In some examples, the opposing surface(s) of the extender 2002 and the first memory device 1700 can be more aligned near proximate edges of the surface(s) and less aligned at points farther apart due to the shape and/or orientation of the opposing surface (s) (e.g., tapered surfaces, non-planar surfaces, etc.). Thus, the alignment of the opposing surfaces can vary along the length of the extender 2002 and/or the mounting adapter assembly 2000 gradually (e.g., a tapered or angled surface) and/or abruptly (e.g., a stepped surface).

The bracket 2004 and the extender 2002 can be manufactured from one or more metallic materials such as aluminum alloy, steel alloy, stainless steel, etc. Thus, in some examples, the body 3201 and the tab 3202 are rigid structures and/or frameworks. In some examples, the bracket 2004 is fabricated from sheet metal that is stamped into the shape and/or configuration as illustrated in FIGS. 20-32. As shown in FIGS. 25 and 26, the bracket includes a first side 2502 opposite of a second side 2504. The first and second sides 2502, 2504 are formed to different lengths, with the second side 2504 configured to a long length relative to the shorter length of the first side 2502. In some examples, internal distance(s) between the first and second sides 2502, 2504 is/are slightly narrower than the thickness 1706 of the first memory device 1700 and/or the thickness of the tab 3202 to improve the strength of the interference fit provided by the dimples 2012. Thus, the first side 2502 is shorter than the second side 2504 to aid in the installation of the bracket 2004 in the assembly 2000. For example, an assembler can lay the first side 2502 against the side of the first memory device 1700 and press down (or snap on) the second side 2504 around the opposing side of the first memory device 1700 to affix the bracket 2004 in place. The first side 2502 includes a slanted edge 2506 to further provide ease of installation and/or removal of the bracket 2004. The slanted edge 2506 is configured at an angle such that the slanted edge 2506 bends away from the first memory device 1700 and the extender 2002. In some examples, the slanted edge 2506 is included on the first side 2502 to facilitate removal of the bracket 2004 from the assembly 2000 when desired. Since the bracket 2004 is configured with the dimples 2012 to generate an interface fit with the first memory device 1700 and tab 3202, removal of the bracket 2004 can be difficult without utilization of a supplementary tool that may damage the assembly 2000. Thus, the slanted edge 2506 is included to provide a gripping location for an assembler (or technician) to apply force and lift up the first side 2502, which removes the bracket 2004 from the assembly 2000 with relative ease. In some examples, the first side 2502 is positioned on the left side of the mounting adapter assembly 2000, and the second side 2504 is positioned on the right side of the mounting adapter assembly 2000 (illustrated in FIGS. 22 and 23). In some other examples, the first side 2502 is positioned on the right side of the mounting adapter assembly 2000, and the second side 2504 is positioned on the left side of the mounting adapter assembly 2000 (illustrated in FIGS. 25 and 26).

In some examples, the cover 2006 is attached to an upper surface of the bracket 2004 via at least one adhesive such as epoxy, polyurethane, silicone adhesives, etc. In other examples, the bracket 2004 and the cover 2006 are integrally formed. The cover 2006 is fixed to the bracket 2004 to fill a gap above the first memory device 1700 and below the upper partition of the storage cage 1902. Thus, in some examples, the upper surface of the body 3201 of the extender 2002 is aligned with an upper surface of the cover 2006. In some examples, the alignment of the surfaces is sufficient to make the surfaces substantially flush (e.g., within +/−0.10 in). However, in other examples, the alignment may not be substantially flush (e.g., within +/−0.25 in, within +/−0.50 in, etc.). In some examples, the upper surface of the body 3201 is offset and/or misaligned with the upper surface of the cover 2006. In some such examples, the upper surfaces of the cover 2006 and/or the body 3201 can be more aligned near proximate and/or distant edges of the surfaces and less aligned at points farther apart and/or closer together, respectively, due to the shape and/or orientation of the surfaces (e.g., tapered surfaces, non-planar surfaces, curved surfaces, etc.). In some other examples, the upper surface of the body 3201 is offset and/or misaligned with the upper surface of the cover 2006 such that the alignment of the upper surfaces of the body 3201 and the cover 2006 varies along the length of the extender 2002, the cover 2006, and/or the mounting adapter assembly 2000 gradually (e.g., a tapered or angled surface) and/or abruptly (e.g., a stepped surface). The cover 2006 can be additively or non-additively manufactured using materials such as polymers such as thermoplastics (e.g., polyoxymethylene) to conserve weight of the mounting adaptor assembly 2000 while providing strength and durability to the cover 2006.

The mounting adaptor assembly 2000 includes the bracket 2004 to provide additional support against torsional and/or bending loads that may be imposed on the extender 2002, the first memory device 1700, and/or the mounting adaptor assembly 2000 during handing, installation, and/or removal. More particularly, as shown in the illustrated example, the bracket 2004 is longer than the first memory device 1700 so as to extend across the interfacing joint between the extender 2002 and the first memory device 1700. In some examples, the bracket 2004 extends beyond the front end of the first memory device 1700 to cover the length of the tab 3202. In some examples, the extender 2002 is fixed to the first memory device 1700 before the bracket 2004 is secured to the tab 3202 and the first memory device 1700. The bracket 2004 of the example mounting adaptor assembly 2000 includes example dimples 2012 to affix and/or couple the bracket 2004 to the first memory device 1700 and the tab 3202 via an interference fit. That is, the dimples 2012 protrude inward (toward the first memory device 1700) to contact the sides of the first memory device 1700 and the tab 3202 and to account for any gap therebetween (e.g., due to dimensioning and/or manufacturing tolerances). An example first upper through hole 2014 and an example second upper through hole 2016 are included in the cover 2006 to provide clearance to fasteners that further fix the bracket 2004 to the tab 3202 of the extender 2002. In this example, other than for the interference fit from the dimples 2012 and the fact that the bracket 2004 extends across (e.g., rests upon) the upper surface of the first memory device 1700, the bracket 2004 is not directly affixed to the first memory device 1700. That is, in some examples, there are no adhesives, fasteners, or other attachment mechanisms directly connecting the bracket 2004 to the first memory device 1700.

As shown in the first cross section 2900 of the mounting adaptor assembly 2000, illustrated in FIGS. 29 and 30, the tab 3202 includes a third threaded hole 2902 to secure a fastener 2904 and to couple the bracket 2004 to the tab 3202 of the extender 2002. The fastener 2904 is an example means for fastening the bracket 2004 and/or the cover 2006 to the tab 3202. As shown in FIGS. 32 and/or 29, the bracket 2004 includes a first upper through hole 3203 and a second upper through hole 2906. The first upper through hole 3203 of the bracket 2004 axially aligns with the first upper through hole 2014 of the cover 2006. Similarly, the second upper through hole 2906 of the bracket 2004 axially aligns with the second upper through hole 2016 of the cover 2006. The first and second upper through holes 3203, 2906 of the bracket 2004 include a smaller diameter than the first and second upper through holes 2014, 2016 of the cover 2006. Therefore, heads of the fasteners 2904 can fit through the first and second upper through holes 2014, 2016 and still contact the upper surface of the bracket 2004 to couple the bracket 2004 to the tab 3202. In some examples, the first and second upper through holes 2014, 2016 are not clearance holes but are machined to a depth that allows the fasteners 2904 to contact the cover 2006 rather than the bracket 2004. Furthermore, although one of the fasteners 2904 is shown in FIG. 29, two of the same fasteners 2904 are illustrated in FIG. 32 to show where the fasteners 2904 are inserted in the first through holes 2014, 3203 and the second through holes 2016, 2906. In some examples, a different number of fasteners with a different number of corresponding holes may be used. Further, in some examples, some or all of the fasteners may connect the bracket 2004 to the extender 2002 via the sides of the bracket 2004 and the extender 2002 rather than via the upper surface.

As shown in the exploded perspective view of the mounted adaptor assembly 2000 in FIG. 32, the extender 2002 includes a first side plate 3204 and a second side plate 3206 to frame the body 3201 and the tab 3202 of the extender 2002. Referring back to FIGS. 29 and 30, the first side plate 3204 includes a base portion 2908 to position (or orient) the second plate 3206. As described below, the extender 2002 is configured as a hollow structured defined by the first and second plates 3204, 3206 joined together via a plurality of fasteners. In some examples, the second plate 3206 can rest upon the base portion 2908 and press against a protrusion 2910 of the first plate 3204 to ensure that clearance and/or threaded holes of the respective first and/or second side plates 3204, 3206 are aligned prior to fastening of the extender 2002. In some examples, the protrusion 2910 is positioned to extend from the first side plate 3204 at a particular distance such that the thickness of the extender 2002 is substantially similar to the thickness 1806 of the second memory device 1800 and/or the thickness 1706 of the first memory device 1700. In some examples, the base portion 2908 protrudes from the first side plate 3204 at a particular distance such that an external surface of the second side plate 3206 is substantially flush with an edge surface of the base portion 2908 when the second side plate 3206 is pressed against the protrusion 2910. In some examples, the base portion 2908 and/or the protrusion 2910 on the first plate 3204 can be included on the second plate 3206 instead of the first plate 3204. In other examples, both of the plates 3204, 3206 can include base portions and/or protrusions that extend toward one another and interface near a midway point between the plates 3204, 3206.

Referring now to FIG. 32, the first side plate 3204 includes a plurality of through holes 3208, and the second side plate 3206 includes a plurality of threaded holes 3210 to couple the first and second side plates 3204, 3206 via fasteners, such as screws. The first side plate 3204 also includes a first through hole 3212 that substantially aligns with the first through hole 1712 of the first memory device 1700, and a second through hole 3214 that substantially aligns with the second through hole 1714 of the first memory device 1700. Thus, in some examples, fasteners located in the first through holes 1712, 3212 and the second through holes 1714, 3214 as well as secured into two of the threaded holes 3210 can couple the first memory device 1700, the first side plate 3204, and the second side plate 3206 together. Although some of the holes are defined as being through holes while other holes are defined as threaded holes, in some examples, any of the holes may be threaded holes or through holes as appropriate to enable the fastening of the different components together.

As illustrated in FIG. 32, the tab 3202 includes a recess 3215 to receive and/or mate with the tab 1708 of the first memory device 1700. In some examples, the recess 3215 is machined to a depth that corresponds to a thickness of the tab 1708 such that external surfaces of the first and second side plates 3204, 3206 are substantially flush with opposing sides of the first memory device 1700. In some examples, the recess 3215 is machined to a depth such that LED(s) disposed on the front end 1710 of the first memory device 1700 are aligned with light tubes disposed inside of the extender 2002 (described below).

In some examples, the latch 1808 includes connectors 3216 that can fit into mating connectors 3218 of the second side plate 3206. In other examples, the mating connectors 3218 can be implemented on the first side plate 3204. One or more of the connectors 3216 on the latch 1808 can be connected to the mating connectors 3218 on the extender 2002 prior to attachment of the first and second side plates 3204, 3206. In some examples, one or more mating connectors 3218 are open-faced slots that become bound by a portion of the first side plate 3204 following attachment of the first and second side plates 3204, 3206. In some examples, the latch 1808 includes threaded holes and/or through holes to provide additional couplings between the latch 1808 and the extender 2002.

The first and second side plates 3204, 3206 frame a hollow interior of the extender 2002. The extender 2002 includes the hollow interior to preserve material usage, reduce the weight of the mounting adaptor assembly 2000, and to provide space for an inner framework 3220 of the extender 2002. The inner framework 3220 is included in the extender 2002 to support a first light tube 3222 and a second light tube 3224 as well as to define the internal distance between the first and second plates 3204, 3206. The first and second light tubes 3222, 3224 are included in the extender 2002 to transmit light from the first and second LEDs on the front end 1710 of the first memory device 1700 to the first and second windows 1812, 1814 of the latch 1808. Thus, when the first and/or second LEDs of the first memory device 1700 illuminate, the first and second light tubes 3222, 3224 allow the lights to be seen at the latch 1808. In some examples, the first window 1812 is disposed above the second window 1814, and the first LED is disposed next to the second LED on the front end 1710 (e.g., substantially equidistant from Earth). Thus, in some examples, the first and second light tubes 3222, 3224 are intertwined. For example, the first light tube 3222 is next to the second light tube 3224 proximal to the front end 1710 and above the second light tube 3224 proximal to the latch 1808.

As shown in FIGS. 33 and 34, the extender 2002 is dimensioned to a length 3302 such that the length of the mounting adaptor assembly 2000 (e.g., the extender 2002 and the bracket 2004 in combination with the first memory device 1700) is substantially similar to the length 1802 of the second memory device 1800. As mentioned previously, the body 3201 (e.g., the body of the first side plate 3204) includes a width (or height) substantially similar to the width 1804 of the second memory device 1800, and the tab 3202 (e.g., the tab of the first side plate 3204) includes a width (or height) substantially similar to the width 1704 of the first memory device 1700. Although the first and second side plates 3204, 3206 of the illustrated example are structured such that the extender 2002 is a solid and hollow framework, the first and second side plates 3204, 3206 can include openings (e.g., windows, holes, vents, etc.) to reduce weight, save material costs, and/or allow cooling air to enter/flow through the extender 2002. In some examples, the body 3201 includes such openings, and the tab 3202 is enclosed. In some other examples, both the body 3201 and the tab 3202 include such openings.

From the foregoing, it will be appreciated that example systems, apparatus, and articles of manufacture have been disclosed that adapt a form factor of a first memory device to fit into a mounting slot or drive bay of a sled that is designed to support a form factor of a second memory device that is larger than the first memory device. Disclosed systems, apparatus, and articles of manufacture enable the first memory device to be installed in the sled without incurring damage to the sled, causing injury to the installer, or necessitating disassembly of the sled to mount the first memory device. Disclosed systems, apparatus, and articles of manufacture enable a latch to connect to a front side of the sled such that the first memory device is properly mounted, installed, and/or supported in the mounting slot and/or fixedly locked in place. Disclosed systems, apparatus, and articles of manufacture enable LEDs disposed on the front of the first memory device to be viewed at the front of the sled in the same manner as the second memory device(s) and/or other memory devices mounted in the sled. Disclosed systems, apparatus, and articles of manufacture effectively increase a width (or height) of the first memory device to cause the cooling air to flow to the sides of the memory devices mounted in the sled 1900, inhibit overheating of the memory devices, and improve the efficiency of the memory devices, the servers, and/or other associated computing devices and/or systems. Disclosed systems, methods, apparatus, and articles of manufacture are accordingly directed to one or more improvement(s) in the operation of a machine such as a computer or other electronic and/or mechanical device.

Example methods, apparatus, systems, and articles of manufacture to support memory devices in server systems are disclosed herein. Further examples and combinations thereof include the following:

Example 1 includes an apparatus comprising an extender including a body and a tab, the tab coupled to a memory device, a first surface of the tab to be aligned with a second surface of the memory device, and a bracket to extend across the second surface of the memory device and the first surface of the tab, the bracket coupled to the first surface of the tab via fasteners.

Example 2 can optionally include the subject matter of Example 1, wherein the first surface is to be substantially flush with the second surface.

Example 3 can optionally include the subject matter of Examples 1-2, further including a cover attached to the bracket, a third surface of the cover to be substantially level with a fourth surface of the body.

Example 4 can optionally include the subject matter of Examples 1-3, wherein the cover is attached to the bracket via an adhesive.

Example 5 can optionally include the subject matter of Examples 1-4, wherein the cover includes a first length, and the bracket includes a second length substantially similar to the first length.

Example 6 can optionally include the subject matter of Examples 1-5, wherein the memory device has an E1.S form factor, and the extender coupled to the memory device results in an E1.L form factor.

Example 7 can optionally include the subject matter of Examples 1-6, wherein the extender includes a front end and a rear end, the tab located at the rear end, the front end coupled to a latch, the latch to affix the apparatus to a mounting slot of a sled.

Example 8 can optionally include the subject matter of Examples 1-7, wherein the memory device includes a front end and a rear end, the front end of the memory device to interface with the rear end of the extender, the front end of the memory device including a light emitting diode, the extender including a light tube to transmit light from the light emitting diode to a window in the latch.

Example 9 can optionally include the subject matter of Examples 1-8, wherein the extender includes a first side plate and a second side plate defining a hollow interior of the extender, the light tube disposed within the hollow interior.

Example 10 can optionally include the subject matter of Examples 1-9, wherein the second side plate includes an inner framework to support the light tube.

Example 11 can optionally include the subject matter of Examples 1-10, wherein the first side plate includes a base portion and a protrusion, the base portion to orient the second side plate relative to first side plate.

Example 12 can optionally include the subject matter of Examples 1-11, wherein the bracket includes dimples protruding inward toward the tab and the memory device, the dimples to provide interference fit between the bracket and at least one of the tab or the memory device.

Example 13 can optionally include the subject matter of Examples 1-12, wherein the tab of the extender is a first tab, the memory device including a second tab. the first tab including a recess to receive the second tab.

Example 14 can optionally include the subject matter of Examples 1-13, wherein the memory device has a first length, and the bracket has a second length, the second length longer than the first length, the bracket to extend across the recess.

Example 15 can optionally include the subject matter of Examples 1-14, wherein the bracket includes first, second, and third sides to extend along the memory device and the tab, the first side opposite the second side with the third side extending therebetween, the third side of the bracket to face the first surface of the tab and the second surface of the memory device.

Example 16 can optionally include the subject matter of Examples 1-15, wherein the first side extends a first length in a first direction perpendicular to the third side, and the second side extends a second length in the first direction, the second length greater than the first length.

Example 17 can optionally include the subject matter of Examples 1-16, wherein the first side includes a slanted edge, the slanted edge to protrude away from the second side at an angle relative to a side surface of the extender.

Example 18 includes an apparatus comprising an extender having a length extending between opposite first and second ends of the extender, the extender having a first surface and a second surface opposite the first surface, the first end of the extender including a recess to mate with a tab on an end of a memory device, the memory device having a third surface and a fourth surface opposite the third surface, the extender to be coupled to the memory device via the tab such that the first surface is positioned adjacent the third surface and the second surface is positioned adjacent the fourth surface, the first and third surfaces to face in a first direction, the second and fourth surfaces to face in a second direction opposite the first direction, and a bracket to be attached to the extender, the bracket to interface with the first, second, third, and fourth surfaces.

Example 19 can optionally include the subject matter of Example 18, wherein a first portion of the length of the extender adjacent the first end has a first dimension measured in a first direction transverse to the length of the extender, a second portion of the length of the extender adjacent the second end has a second dimension measured in the first direction, the second dimension greater than the first dimension, and the memory device has a third dimension measured in the first direction when the memory device is coupled to the extender, the first dimension corresponding to the third dimension.

Example 20 can optionally include the subject matter of Examples 18-19, wherein the first portion of the length of the extender is a first length, the memory device has a second length, and the bracket has a third length, the third length corresponding to a sum of the first length and the second length.

Example 21 includes an apparatus comprising means for extending a first length of a memory device to a second length, the extending means including a first tab, the memory device including a second tab to interface with the first tab to align opposing surfaces of the memory device with opposing surfaces of the extending means, and means for securing the memory device and the extending means in elongate alignment, the elongate alignment securing means to contact the opposing surfaces of the memory device and the opposing surfaces of the extending means.

Example 22 can optionally include the subject matter of Example 21, wherein the elongate alignment securing means has a third length, the third length greater than the first length.

Example 23 includes a system comprising a sled including drive bays dimensioned to receive first memory devices having a first form factor, a second memory device having a second form factor smaller than the first form factor, and an extender to attach to the second memory device, the extender dimensioned to make up a difference in length between the first form factor and the second form factor to enable the second memory device to be supported in one of the drive bays.

Example 24 can optionally include the subject matter of Example 23, further including a cover to be supported adjacent the second memory device, the cover to make up a difference in height between the first form factor and the second form factor.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:

an extender including a body and a tab, the extender including a first surface and a second surface opposite the first surface, the body and the tab having a same thickness in a first direction, the thickness defined by a distance between the first and second surfaces, the tab being a longitudinal extension of the body such that the body and the tab collectively define a longitudinal length of the extender in a second direction transverse to the first direction, the body having a first width in a third direction transverse to the first direction and transverse to the second direction, the first width defined by opposing third and fourth surfaces of the body, the tab having a second width in the third direction, the second width defined by opposing fifth and sixth surfaces of the tab, the second width less than the first width, the fifth surface of the tab being a longitudinal extension of the third surface of the body, the tab to be coupled to a memory device, the sixth surface of the tab to be aligned with and face a same direction as a seventh surface of the memory device; and a bracket to extend across the seventh surface of the memory device and the sixth surface of the tab, the bracket coupled to the sixth surface of the tab via fasteners.

2. The apparatus of claim 1, wherein the sixth surface is to be substantially flush with the seventh surface.

3. The apparatus of claim 1, including a cover attached to the bracket, a sixth surface of the cover to be substantially flush with the second surface of the body.

4. The apparatus of claim 3, wherein the cover is attached to the bracket via an adhesive.

5. The apparatus of claim 3, wherein the cover includes a first length, and the bracket includes a second length substantially similar to the first length.

6. The apparatus of claim 1, wherein the memory device has an E1.S form factor, and the extender coupled to the memory device results in an E1.L form factor.

7. The apparatus of claim 1, wherein the extender includes a front end and a rear end, the tab located at the rear end, the front end coupled to a latch, the latch to affix the apparatus to a mounting slot of a sled.

8. The apparatus of claim 7, wherein the memory device includes a front end and a rear end, the front end of the memory device to interface with the rear end of the extender, the front end of the memory device including a light emitting diode, the extender including a light tube to transmit light from the light emitting diode to a window in the latch.

9. The apparatus of claim 8, wherein the extender includes a first side plate corresponding to the first surface of the extender and a second side plate corresponding to the second surface of the extender, the first and second side plates defining a hollow interior of the extender, the light tube disposed within the hollow interior.

10. The apparatus of claim 9, wherein the second side plate includes an inner framework to support the light tube.

11. The apparatus of claim 9, wherein the first side plate includes a base portion and a protrusion, the base portion to orient the second side plate relative to the first side plate.

12. The apparatus of claim 1, wherein the bracket includes dimples protruding inward toward the tab and the memory device, the dimples to provide an interference fit between the bracket and at least one of the tab or the memory device.

13. The apparatus of claim 1, wherein the tab of the extender is a first tab, the memory device including a second tab, the first tab including a recess to receive the second tab.

14. The apparatus of claim 13, wherein the memory device has a first length, and the bracket has a second length, the second length longer than the first length, the bracket to extend across the recess.

15. The apparatus of claim 1, wherein the bracket includes first, second, and third sides to extend along the memory device and the tab, the first side opposite the second side with the third side extending therebetween, the third side of the bracket to face the sixth surface of the tab and the seventh surface of the memory device.

16. The apparatus of claim 15, wherein the first side extends a first length in the second direction, and the second side extends a second length in the second direction, the second length greater than the first length.

17. The apparatus of claim 16, wherein the first side includes a slanted edge, the slanted edge to protrude away from the second side at an angle relative to the first surface of the extender.

18. An apparatus comprising:

an extender having a length extending between opposite first and second ends of the extender, the extender having a first surface and a second surface opposite the first surface, the first and second surfaces defining a thickness of the extender, the first end of the extender including a recess to mate with a tab on an end of a memory device, the recess extending between opposing third and fourth surfaces of a first portion of the length of the extender, the third and fourth surfaces defining a width of the first portion that is perpendicular to the thickness of the extender and perpendicular to the length the extender, the memory device having a fifth surface and a sixth surface opposite the fifth surface, the extender to be coupled to the memory device via the tab such that the first surface is adjacent the fifth surface and the second surface is adjacent the sixth surface, the first and fifth surfaces to face in a first direction, the second and sixth surfaces to face in a second direction opposite the first direction; and a bracket to be attached to the extender, the bracket to interface with the first, second, third, fifth, and sixth surfaces, the bracket to be spaced apart from the fourth surface.

19. The apparatus of claim 18, wherein the width of the first portion is a first width, a second portion of the length of the extender adjacent the second end has a second width that is greater than the first width, and the memory device has a third width, the first width corresponding to the third width.

20. The apparatus of claim 19, wherein the first portion of the length of the extender is a first length, the memory device has a second length, and the bracket has a third length, the third length corresponding to a sum of the first length and the second length.

21. An apparatus comprising:

means for extending a first length of a memory device to a second length, the extending means including a body and a first tab, the first tab having a first height between opposing first and second surfaces of the first tab, the body having a second height between opposing third and fourth surfaces of the body, the second height greater than the first height, the memory device including a second tab to interface with the first tab to align opposing fifth and sixth surfaces of the memory device with opposing seventh and eighth surfaces of the extending means; and means for securing the memory device and the extending means in elongate alignment, the elongate alignment securing means to contact the opposing fifth and sixth surfaces of the memory device, the opposing seventh and eighth surfaces of the extending means, and the first surface of the first tab, the elongate alignment securing means spaced apart from the opposing third and fourth surfaces of the body and the second surface of the first tab.

22. The apparatus of claim 21, wherein the elongate alignment securing means has a third length, the third length greater than the first length.

23. A system comprising:

a sled including drive bays dimensioned to receive first memory devices having a first form factor;

a second memory device having a second form factor smaller than the first form factor;

an extender to attach to the second memory device, the extender dimensioned to make up a difference in length between the first form factor and the second form factor to enable the second memory device to be supported in one of the drive bays, a first portion of a length of the extender having a first height corresponding to the first form factor, a second portion of the length of the extender having a second height corresponding to the second form factor, the first portion to be distal from the second memory device with the second portion therebetween; and a cover to be supported adjacent the second portion of the extender and adjacent the second memory device, the cover to make up a difference in height between the first form factor and the second form factor along the second portion of the extender and along the second memory device.

24. The system of claim 23, including a bracket to be between a first surface of the second portion of the extender and the cover, the first surface to face towards the cover, the bracket to interface with second and third surfaces of the second portion on opposing sides of the first surface, the bracket to be between a fourth surface of the second memory device of the extender and the cover, the fourth surface to face towards the cover, the bracket to interface with fifth and sixth surfaces of the second memory device on opposing sides of the fourth surface.

* * * * *